United States Patent
Muto et al.

(10) Patent No.: US 7,374,965 B2
(45) Date of Patent: May 20, 2008

(54) MANUFACTURING METHOD OF SEMICONDUCTOR DEVICE

(75) Inventors: Akira Muto, Haruna (JP); Ichio Shimizu, Tamamura (JP); Katsuo Arai, Takasaki (JP); Hidemasa Kagii, Takasaki (JP); Hiroshi Sato, Takasaki (JP); Hiroyuki Nakamura, Maebashi (JP); Takuya Nakajo, Numata (JP); Keiichi Okawa, Takasaki (JP); Masahiko Osaka, Yuki (JP)

(73) Assignee: Renesas Technology Corp., Tokyo (JP)

( * ) Notice: Subject to any disclaimer, the term of this patent is extended or adjusted under 35 U.S.C. 154(b) by 286 days.

(21) Appl. No.: 11/348,362

(22) Filed: Feb. 7, 2006

(65) Prior Publication Data

US 2006/0177967 A1  Aug. 10, 2006

(30) Foreign Application Priority Data

Feb. 8, 2005   (JP)   ............................. 2005-031597

(51) Int. Cl.
H01L 21/00 (2006.01)
(52) U.S. Cl. .................. 438/106; 438/109; 438/112; 438/118
(58) Field of Classification Search ................ 438/118, 438/109, 455–459, 584, 612–618
See application file for complete search history.

(56) References Cited

U.S. PATENT DOCUMENTS

| | | | |
|---|---|---|---|
| 5,849,460 A * | 12/1998 | Kawai et al. | 430/280.1 |
| 2002/0066953 A1* | 6/2002 | Ishiwata et al. | 257/700 |
| 2003/0057573 A1* | 3/2003 | Sekine et al. | 257/787 |
| 2004/0142509 A1* | 7/2004 | Imai | 438/109 |
| 2006/0043613 A1* | 3/2006 | Kobayakawa | 257/787 |
| 2006/0051900 A1* | 3/2006 | Shizuno | 438/124 |

FOREIGN PATENT DOCUMENTS

| | | |
|---|---|---|
| JP | 2000-243880 | 9/2000 |
| JP | 2000-243887 | 9/2000 |
| JP | 2003-054638 | 2/2003 |
| JP | 2003-066205 | 3/2003 |
| JP | 2003-086737 | 3/2003 |
| JP | 2003-204732 | 7/2003 |

* cited by examiner

Primary Examiner—Kiesha Rose
Assistant Examiner—Eric W Jones
(74) Attorney, Agent, or Firm—Antonelli, Terry, Stout & Kraus, LLP.

(57) ABSTRACT

A semiconductor device in the form of a resin sealed semiconductor package is disclosed, wherein a gate terminal connected to a gate pad electrode formed on a surface of a semiconductor chip and a source terminal connected to a source pad electrode formed on the chip surface exposed to a back surface of a sealing resin portion, a first portion of a drain terminal connected to a back-surface drain electrode of the semiconductor chip is exposed to an upper surface of the sealing resin portion, and a second portion of the drain terminal formed integrally with the first portion of the drain terminal is exposed to the back surface of the sealing resin portion. When forming the sealing resin portion in such a semiconductor device, first the sealing resin portion is formed so as to also cover an upper surface of the first portion of the drain terminal and thereafter the upper surface side of the sealing resin portion is polished by liquid honing, thereby allowing the upper surface of the first portion of the drain terminal to be exposed on the upper surface of the sealing resin portion. Both heat dissipating property and production yield of the semiconductor device are improved.

22 Claims, 23 Drawing Sheets

MANUFACTURING METHOD OF SEMICONDUCTOR DEVICE

CROSS-REFERENCE TO RELATED APPLICATION

The present application claims priority from Japanese patent application No. 2005-031597 filed on Feb. 8, 2005, the content of which is hereby incorporated by reference into this application.

BACKGROUND OF THE INVENTION

The present invention relates to a method of manufacturing a semiconductor device and more particularly to a technique applicable effectively to the manufacture of a semiconductor device which is in the form of a resin sealed semiconductor package.

Various semiconductor packages are in use, among which there is known a resin sealed semiconductor package including a semiconductor chip sealed with a resin sealing portion. In the resin sealed semiconductor package, a semiconductor chip is sealed within the resin sealing portion, so that the reliability of the semiconductor chip can be improved. Besides, by exposing terminals on a back surface of the resin sealing portion it becomes possible to effect surface-mounting of the resin sealed semiconductor package.

In Japanese Unexamined Patent Publication No. 2003-86737 (Patent Literature 1) there is disclosed a technique for providing a semiconductor device of a surface mounting type having a mounting surface to be joined to a mounting substrate, which semiconductor device includes a lead frame, a semiconductor chip and resin provided so as to cover the semiconductor chip and wherein front end faces of electrode terminals drawn out through the lead frame from the semiconductor chip and surfaces of two or more electrodes disposed on the semiconductor chip are exposed in a generally planar shape onto the mounting surface.

In Japanese Unexamined Patent Publication No. 2000-243880 (Patent Literature 2) there is disclosed a technique wherein a semiconductor pellet is fixed onto an island, a first post electrode is bonded to an electrode pad on the semiconductor pellet, a second post electrode is fixed to an extending portion of the island, and then the whole is coated with a resin layer, thereby allowing head portions of the first and second post electrodes to be exposed to the surface of the resin layer and serve as terminals for external connection.

In Japanese Unexamined Patent Publication No. 2000-243887 (Patent Literature 3) there is disclosed a technique wherein a semiconductor pellet is fixed onto an island, a post electrode is bonded to an electrode pad on the semiconductor pellet, an extending portion of the island is bent to about the same degree of height as the post electrode, and then the whole is coated with a resin layer, thereby allowing a head portion of the post electrode and that of the extending portion to be exposed to the surface of the resin layer and serve as terminals for external connection.

[Patent Literature 1]
Japanese Unexamined Patent Publication No. 2003-86737
[Patent Literature 2]
Japanese Unexamined Patent Publication No. 2000-243880
[Patent Literature 3]
Japanese Unexamined Patent Publication No. 2000-243887

SUMMARY OF THE INVENTION

Studies made by the present inventors have revealed the following facts.

In a resin sealed semiconductor package, by exposing terminals on a lower surface (back surface) of a resin sealing portion, it becomes possible to effect surface mounting of the resin sealed semiconductor package. Moreover, by exposing terminals not only on the lower surface of the resin sealing portion but also on both upper and lower surfaces of the resin sealing portion, it is possible to improve the heat dissipating characteristic of the resin sealed semiconductor package. Further, the resin sealing portion can be formed by pouring a sealing resin material into cavities of both upper and lower mold halves in a molding process.

In manufacturing such a resin sealed semiconductor package with terminals exposed to both upper and lower surfaces of the sealing resin portion, plural terminals are disposed on both upper and lower sides of a semiconductor chip, then in a molding process a mold is clamped in such a manner that the terminals on the upper side of the semiconductor chip comes into contact with an upper mold half and the terminals on the lower side of the semiconductor chip comes into contact with a lower mold half, then in this state a sealing resin material is poured into a mold cavity and is hardened, whereby a sealing resin portion can be formed so that terminals are exposed to both upper and lower surfaces of the sealing resin portion.

However, when the mold is clamped in the molding process in such a manner that the terminals on the upper side of the semiconductor chip come into contact with the upper mold half and the terminals on the lower side of the semiconductor chip come into contact with the lower mold half, if the height of the assembly concerned varies just before the molding process or if the parallelism between the upper and lower terminals of the semiconductor chip varies, it is likely that strong pressures may be applied from both upper and lower mold halves, i.e., from both above and below, to the semiconductor chip through both upper and lower terminals of the semiconductor chip. Once pressures are applied from above and below to the semiconductor chip, there is a fear that the semiconductor chip may be cracked, with consequent lowering of the production yield of the semiconductor device which is in the form of a resin sealed semiconductor package.

It is an object of the present invention to provide a technique able to improve the production yield of a semiconductor device.

It is another object of the present invention to provide a technique able to improve the heat dissipating characteristic of a semiconductor device.

The above and other objects-and novel features of the present invention will become apparent from the following description and the accompanying drawings.

The following is an outline of typical modes of the present invention as disclosed herein.

According to the present invention, in manufacturing a semiconductor device in the form of a resin sealed semiconductor package having exposed conductors on both upper and lower surfaces thereof, first and second conductor portions are bonded to first and second main surfaces, respectively, of a semiconductor chip, a sealing resin portion for sealing the semiconductor chip and the first and second conductor portions is formed so as to cover an upper surface of the first conductor portion, and thereafter the sealing resin portion positioned over the first conductor portion is removed, allowing the first conductor portion to be exposed from the sealing resin portion.

Further, according to the present invention, in manufacturing a semiconductor device of a resin sealed semiconductor package type having exposed conductors on both upper and lower surfaces-thereof, a first conductor portion of a first conductor member is bonded to a first main surface of a semiconductor chip, a second conductor portion of a second conductor member is bonded to a second main surface of the semiconductor chip, the first and second conductor members are fixed to a mold in such a manner that the first and second conductor portions and the semiconductor chip are disposed within a cavity of the mold and that a surface of the first conductor portion on the side opposite to the side opposed to the semiconductor chip is not pressurized by the mold, then a material for forming a sealing resin portion is introduced into the cavity to form a sealing resin portion for sealing the first and second conductor portions and the semiconductor chip, and thereafter a part of the sealing resin portion is removed to expose the surface of the first conductor portion from the sealing resin portion.

The following is a brief description of effects obtained by the typical modes of the present invention as disclosed herein.

It is possible to improve the production yield of the semiconductor device.

It is possible to improve the heat dissipating characteristic of the semiconductor device.

DETAILED DESCRIPTION OF PREFERRED EMBODIMENTS

Figure 1:
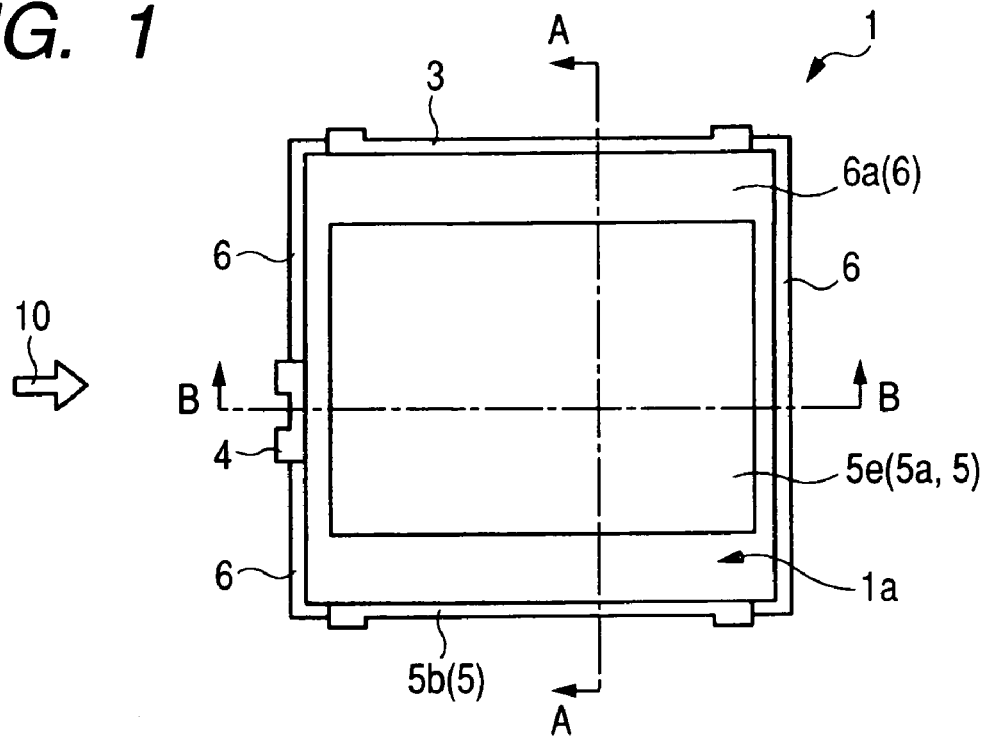
FIG. 1 is a top view of a semiconductor device according to an embodiment of the present invention.

Where required for convenience' sake, the following embodiments will each be described in a divided manner into plural sections, but unless otherwise mentioned, they are not unrelated to each other, but are in a relation such that one is a modification or a detailed or supplementary explanation of part or the whole of the other. In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to. Further, it goes without saying that in the following embodiments their constituent elements (including constituent steps) are not always essential unless otherwise-mentioned and except the case where they are considered essential basically obviously. Likewise, it is to be understood that when reference is made to the shapes and positional relation of constituent elements in the following embodiments, those substantially closely similar to or resembling such shapes, etc. are also included unless otherwise mentioned and except the case where a negative answer is evident basically. This is also true of the foregoing numerical value and range.

Embodiments of the present invention will be described in detail hereinunder. In all of the drawings for illustrating the embodiments, portions having the same functions are identified by like reference numerals, and repeated explanations thereof will be omitted. In the following embodiments, explanations of the same or similar portions will not be repeated in principle except where such explanations are specially required.

In the drawings related to the following embodiments, hatching may be omitted even in a sectional view in order to make the drawing easier to see, and even a plan view may be hatched to make it easier to see.

First Embodiment

A semiconductor device according to a first embodiment of the present invention will be described below with reference to drawings.

Figure 2:
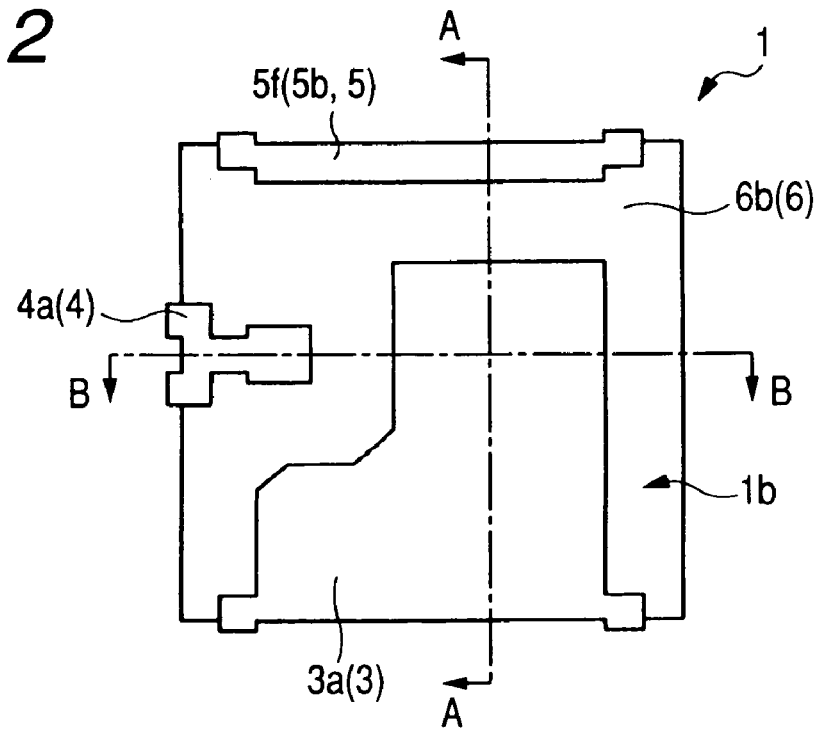
FIG. 2 is a bottom view of the semiconductor device of FIG. 1.
Figure 3:
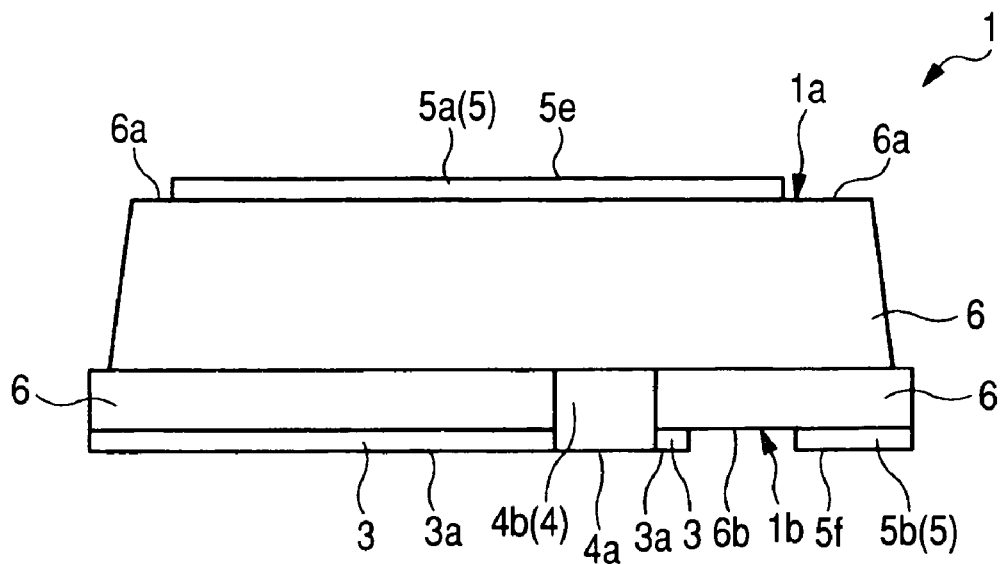
FIG. 3 is a side view of the semiconductor device of FIG. 1.
Figure 4:
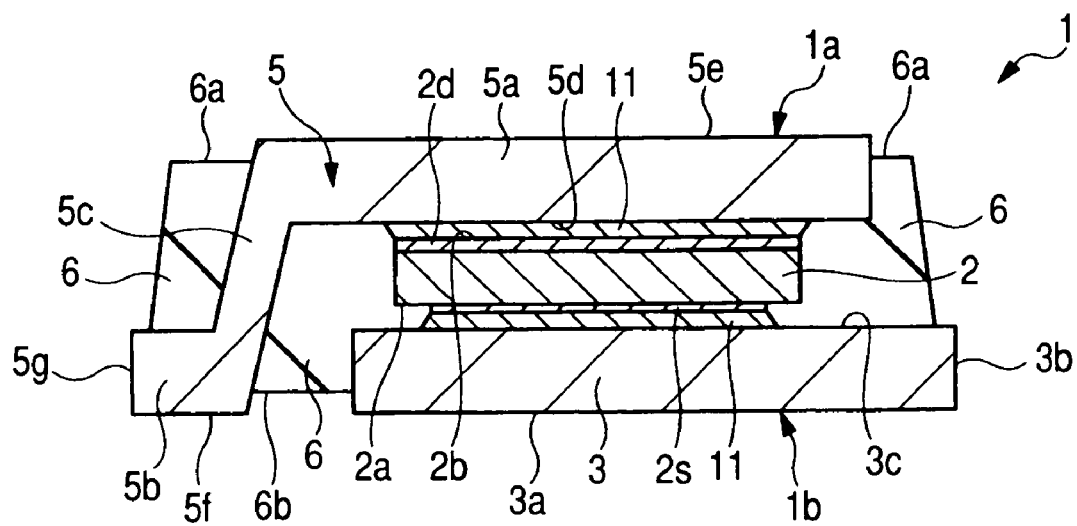
FIG. 4 is a sectional view of the semiconductor device of FIG. 1.
Figure 5:
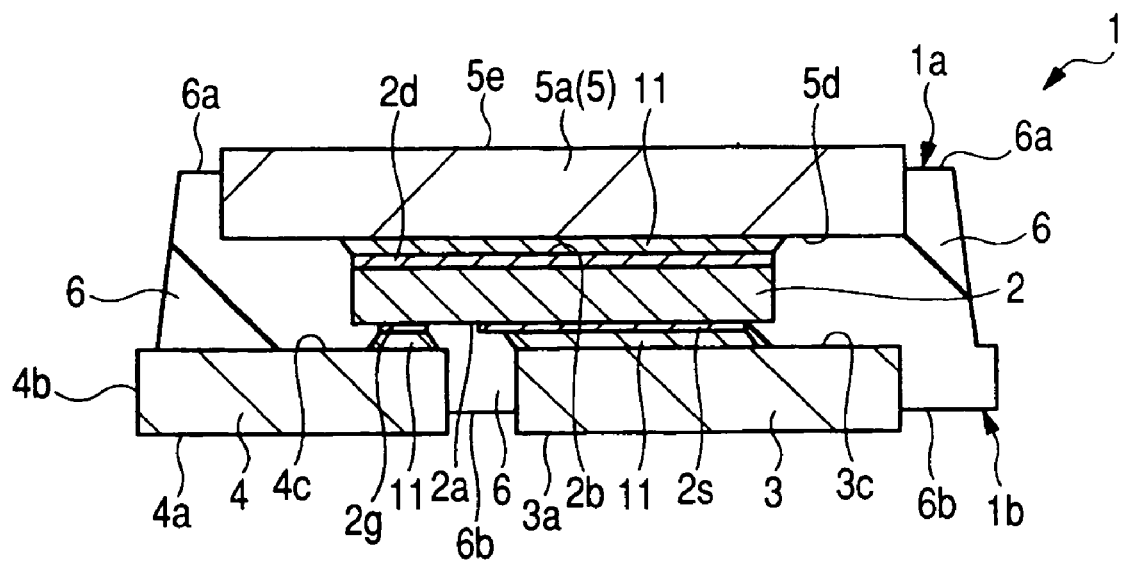
FIG. 5 is a sectional view of the semiconductor device of FIG. 1.

FIG. 1 is a top view (plan view) of a semiconductor device 1 according to an embodiment of the present invention, FIG. 2 is a bottom view (back view or plan view) thereof, FIG. 3 is a side view thereof, and FIGS. 4 and 5 are sectional views (sectional side views) thereof. A section taken on line A-A in FIG. 1 (i.e., a section taken on line A-A in FIG. 2) corresponds approximately to FIG. 4 and a section taken on line B-B in FIG. 1 (i.e., a section taken on line B-B in FIG. 2) corresponds approximately to FIG. 5. FIG. 3 corresponds approximately to a side view of the semiconductor device 1 as seen in the direction of arrow 10 in FIG. 1.

The semiconductor device (semiconductor package) 1 of this embodiment is a resin sealed, surface mounting type semiconductor package. That is, the semiconductor device 1 is in the form of a resin sealed semiconductor package.

The semiconductor device 1 of this embodiment shown in FIGS. 1 to 5 includes a semiconductor chip 2, a source terminal (terminal for source, source connecting conductor portion, or conductor portion) 3 formed by a conductor, a gate terminal (terminal for gate, gate connecting conductor portion, or conductor portion) 4, a drain terminal (terminal for drain, drain connecting conductor portion, or conductor portion) 5, and a sealing resin portion (sealing portion or sealing resin) 6 for sealing those components.

The sealing resin portion 6 is formed of a resin material, e.g., a thermosetting resin, and may contain fillers or the like. For example, the sealing resin portion 6 may be formed using a filler-containing epoxy resin. The semiconductor chip 2, source terminal 3, gate terminal 4 and drain terminal 5 are sealed and protected by the sealing resin portion 6. The sealing resin portion 6 includes an upper surface (surface or first surface) 6a and a back surface (bottom, lower surface, or second surface) 6b which are two main surfaces positioned opposite to each other. The back surface 6b of the sealing resin portion 6, i.e., a back surface (bottom or lower surface) 1b of the semiconductor device 1, is a mounting surface of the semiconductor device 1.

The semiconductor chip 2 is obtained, for example, by forming various semiconductor elements or semiconductor integrated circuits on a semiconductor substrate (semiconductor wafer) formed by a single crystal silicon or the like, thereafter polishing a back surface of the semiconductor substrate if necessary, and then dividing the semiconductor substrate into individual semiconductor chips 2 by dicing for example. The semiconductor chip 2 is sealed within the sealing resin portion 6.

In this embodiment, as the semiconductor chip 2 there may be used, for example, a semiconductor chip formed with a vertical power MISFET (Metal Insulator Semiconductor Field Effect Transistor) having a trench type gate structure for example. The semiconductor chip 2 has a surface (main surface on the side where a semiconductor element is formed, or second main surface) 2a and a back surface (main surface on the side opposite to the surface 2a, or first main surface) 2b which are two main surfaces positioned opposite to each other., The semiconductor chip 2 has a source pad electrode (surface electrode) 2s and a gate pad electrode (surface electrode) 2g both formed on the surface 2a of the semiconductor chip and further has a back-surface drain electrode (back-surface electrode) 2d formed over the whole of the back surface 2b of the semiconductor chip. The source pad electrode 2s is connected electrically to the source of MISFET formed within the semiconductor chip 2. Likewise, the gate pad electrode 2g is connected electrically to the gate electrode of the MISFET and the surface drain electrode 2d is connected electrically to the drain of the MISFET.

Figure 6:
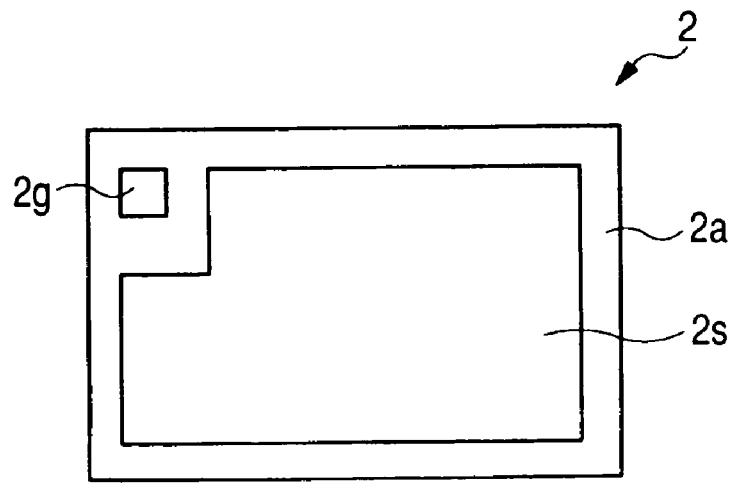
FIG. 6 is a plan view showing an example of layout of a semiconductor chip used in the semiconductor device of FIG. 1.
Figure 7:
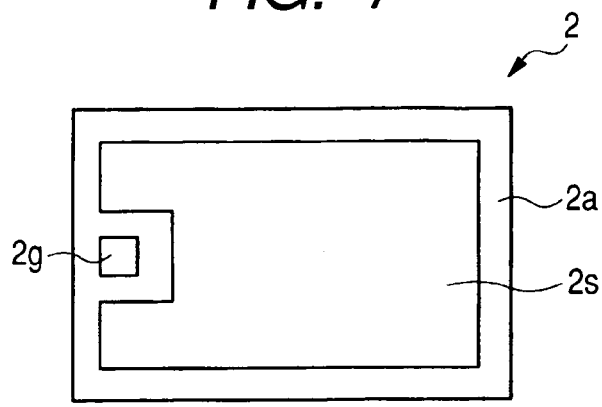
FIG. 7 is a plan view showing another example of layout of a semiconductor chip used in the semiconductor device of FIG. 1.

FIG. 6 is a plan view (top view) showing an example of layout of the semiconductor chip 2 and FIG. 7 is a plan view (top view) showing another example of layout of the semiconductor chip 2. In the semiconductor chip 2 used in this embodiment, as shown in FIGS. 6 and 7, the source pad electrode 2s and the gate pad electrode 2g are formed on the surface 2a of the semiconductor chip 2, provided the layout of the electrodes may be changed where required. For example, as shown in FIG. 7, the gate pad electrode 2g may be formed near the center of an end portion of the surface 2a of the semiconductor chip 2, or, as shown in FIG. 6, the gate pad electrode 2g may be formed near a corner of the surface 2a of the semiconductor chip 2.

The source terminal 3, gate terminal 4 and drain terminal 5 are constituted by conductors and are each formed of a metallic material such as, for example, copper (Cu) or copper alloy. The semiconductor chip 2 is disposed between the source terminal 3 and gate terminal 4 both underlying the semiconductor chip and the drain terminal 5 overlying the semiconductor chip 2 in such a manner that its surface 2a faces downward. Through an electrically conductive bonding material (adhesive material) 11 such as solder, the source terminal 3 is joined (bonded or connected) to the source pad electrode 2s formed on the surface 2a of the semiconductor chip 2, the gate terminal 4 is joined (bonded or connected) to the gate pad electrode 2g formed on the surface 2a of the semiconductor chip 2, and the drain terminal 5 is joined (bonded or connected) to the back-surface drain electrode 2d formed on the back surface 2b of the semiconductor chip 2. Therefore, the source terminal 3 is connected electrically through the bonding material 11 to the source pad electrode 2s formed on the semiconductor chip 2, the gate terminal 4 is connected electrically through the bonding material 11 to the gate pad electrode 2g formed on the semiconductor chip 2, and the drain terminal 5 is connected electrically through the bonding material 11 to the back-surface drain electrode 2d formed on the semiconductor chip 2.

A lower surface (surface) 3a of the source terminal (second conductor portion) is exposed to the back surface (second surface) 6b of the sealing resin portion 6. A side face (end face or end portion) 3b of the source terminal 3 is exposed to a side face of the sealing resin portion 6 and the other side face (end portion) of the source terminal 3 is covered and sealed with the sealing resin portion 6. The exposed side face 3b of the source terminal 3 is a side face (end face) resulting from a cutting process in the course of manufacture of the semiconductor device 1. A part of an upper surface 3c of the source terminal 3 is joined to the source pad electrode 2s of the semiconductor chip 2 through the electrically conductive bonding material 11, while the other portion of the upper surface 3c of the source terminal 3 is covered and sealed with the sealing resin portion 6.

A lower surface (surface) 4a of the gate terminal 4 is exposed to the back surface (second surface) 6b of the sealing resin portion 6. A side face (end face or end portion) 4b of the gate terminal 4 is exposed to a side face of the sealing resin portion 6 and the other side face (end portion) of the gate terminal 4 is covered and sealed with the sealing resin portion 6. The exposed side face 4b of the gate terminal 4 is a side face (end face) resulting from the cutting process in the course of manufacture of the semiconductor device 1. A part of an upper surface 4c of the gate electrode 4 is joined to the gate pad electrode 2g of the semiconductor chip 2 through the electrically conductive bonding material 11, while the other portion of the upper surface 4c of the gate terminal 4 is covered and sealed with the sealing resin portion 6.

The drain terminal 5 includes a first portion (chip connecting portion or conductor portion) 5a, a second portion (external terminal constituting portion or conductor portion) 5b, and a stepped portion (bent portion, connecting portion, or conductor portion) 5c which provides a connection between the first portion 5a and the second portion 5b. The first portion 5a, the second portion 5b and the stepped portion 5c are integrally formed using the same electrically conductive material, and the first and second portions 5a, 5b which are different in height are connected together through the stepped portion 5c.

A part of a lower surface 5d of the first portion 5a of the drain terminal 5 is joined to the back-surface drain electrode 2d of the semiconductor chip 2 through the electrically bonding material 11, while the other portion of the lower surface 5d of the first portion 5a of the drain terminal 5 is covered and sealed with the sealing resin portion 6. An upper surface (surface) 5e of the first portion (first conductor portion) 5a of the drain terminal (first conductor portion) is exposed to the upper surface (first surface) 6a of the sealing resin portion 6. The stepped portion 5c of the drain terminal 5 is covered with the sealing resin portion 6 and is sealed therein. A lower surface 5f (a surface different from the upper surface 5e of the first portion 5a) of the second portion 5b of the drain terminal (first conductor portion) 5 is exposed to the back surface (second surface) 6b of the sealing resin portion 6. A side face (end face or end portion) 5g (i.e., a side face 5g of the end portion located on the side opposite to the side where the second portion 5b is connected to the stepped portion 5c) of the second portion 5b of the drain terminal 5 is exposed to a side face of the sealing resin portion 6, while the other side face (end portion) of the second portion 5b of the drain terminal 2 is covered and sealed with the sealing resin portion 6. The exposed side face 5g of the drain terminal 5 is a side face (end face) resulting from the cutting process in the course of manufacture of the semiconductor device 1.

It is preferable that the lower surface 3a of the source terminal 3 exposed to the back surface 6b of the sealing resin portion 6, the lower surface 4a of the gate terminal 4 (second conductor portion) and the lower surface 5f of the second portion 5b of the drain terminal 5 be substantially flush with one another. As will be described later, it is preferable that the lower surface 3a of the source terminal 3, the lower surface 4a of the gate terminal (second conductor portion) 4 and the lower surface 5f of the second portion 5b of the drain terminal 5 be not flush with the back surface 6b of the sealing resin portion 6, but be in a slightly projecting state from the back surface 6b. Likewise, as will be described later, it is preferable that the upper surface 5e of the first portion 5a of the drain terminal 5 be not flush with the upper surface 6a of the sealing resin portion 6, but be in a slightly projecting state from the upper surface 6a of the sealing resin portion 6.

Thus, the lower surface 3a of the source terminal 3, the lower surface 4a of the gate terminal 4 and the lower surface 5f of the second portion 5b of the drain terminal 5 are exposed to the back surface bottom) 1b of the semiconductor device 1 which back surface corresponds to the back surface 6b of the sealing resin portion 6, and these exposed portions (i.e., the lower surface 3a of the source terminal 3, the lower surface 4a of the gate terminal 4 and the lower surface 5f of the second portion 5b of the drain terminal 5) function as external terminals (terminals, external connection terminals, or external connecting terminals) of the semiconductor device 1. Since the source terminal 3, gate terminal 4 and drain terminal 5 are exposed to the back surface 1b of the semiconductor device 1, it is possible to effect surface mounting of the semiconductor device 1, and the back surface 1b of the semiconductor device 1, (the back surface 6b of the sealing resin portion 6), serves as a mounting surface of the semiconductor device 1.

Moreover, in the semiconductor device 1 of this embodiment, the upper surface 5e of the first portion 5a of the drain terminal 5 is exposed to the upper surface 1*a* (the main surface on the side opposite to the back surface 1*b*) of the semiconductor device 1, that is, to the surface 6*a* of the sealing resin portion 6.

Thus, the semiconductor device 1 of this embodiment is in the form of resin sealed semiconductor package having exposed conductors on both upper and lower surfaces thereof, and the first portion 5*a* of the drain terminal 5 becomes an exposed conductor on the upper surface 1*a* (upper surface 6*a*) side, while the source terminal 3, the gate terminal 4 or the second portion 5*b* of the drain terminal 5 becomes an exposed conductor on the back surface 1*b* (back surface 6*b*) side. This is not limited to the back surface 1*b* side of the semiconductor device (the back surface 6*b* side of the sealing resin portion 6). Also on the upper surface (surface) 1*a* side of the semiconductor device 1 (the upper surface 6*a* side of the sealing resin 6) there is exposed a conductor portion (the first portion 5*a* of the drain terminal 5) connected (joined) to the semiconductor chip 2. As a result, it becomes possible to improve the heat dissipating characteristic of the semiconductor device 1 and hence improve the performance of the semiconductor device.

Figure 8:
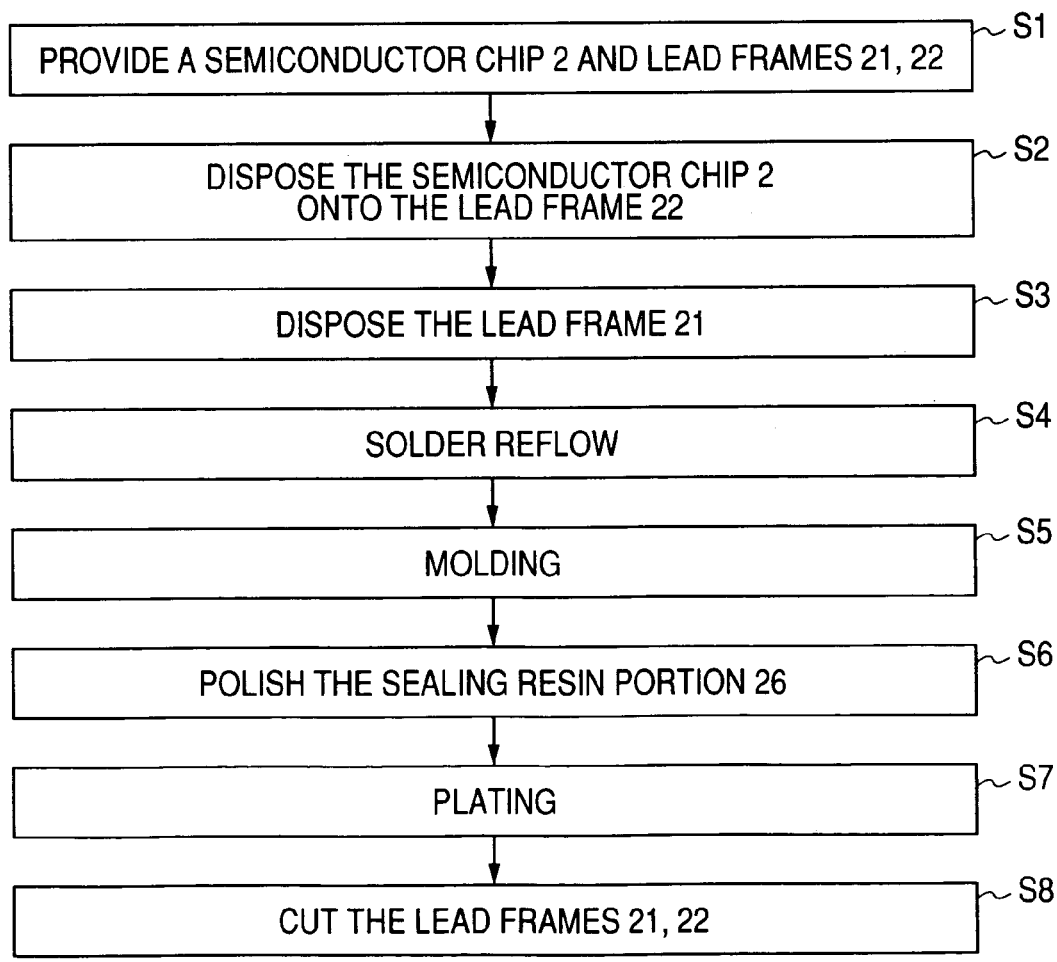
FIG. 8 is a flow chart showing a manufacturing process for the semiconductor device embodying the present invention.
Figure 9:
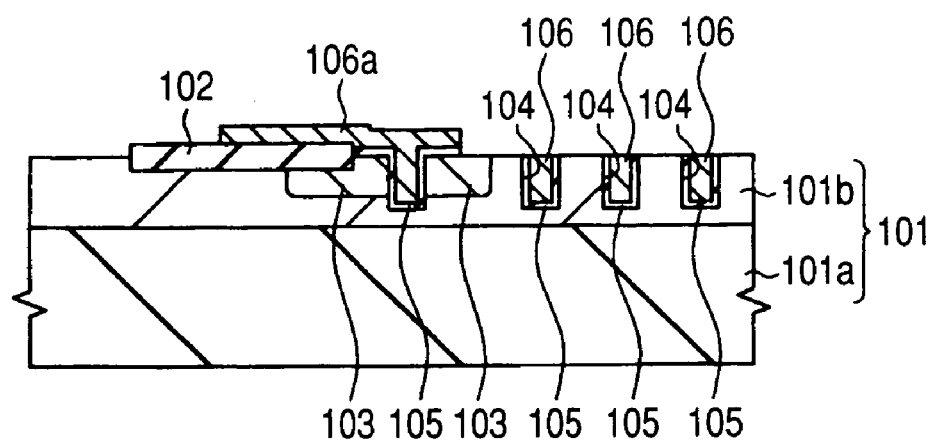
FIG. 9 is a sectional view of a principal portion of a semiconductor chip in a semiconductor chip manufacturing step.
Figure 10:
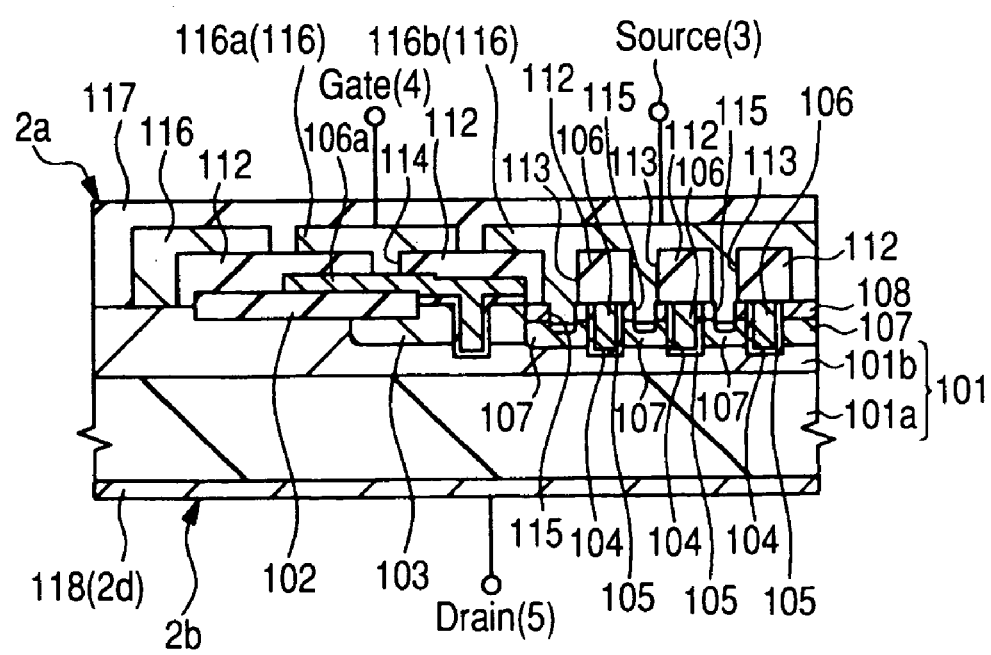
FIG. 10 is a sectional view of the principal portion of the semiconductor chip in a semiconductor chip manufacturing step which follows FIG. 10.
Figure 19:
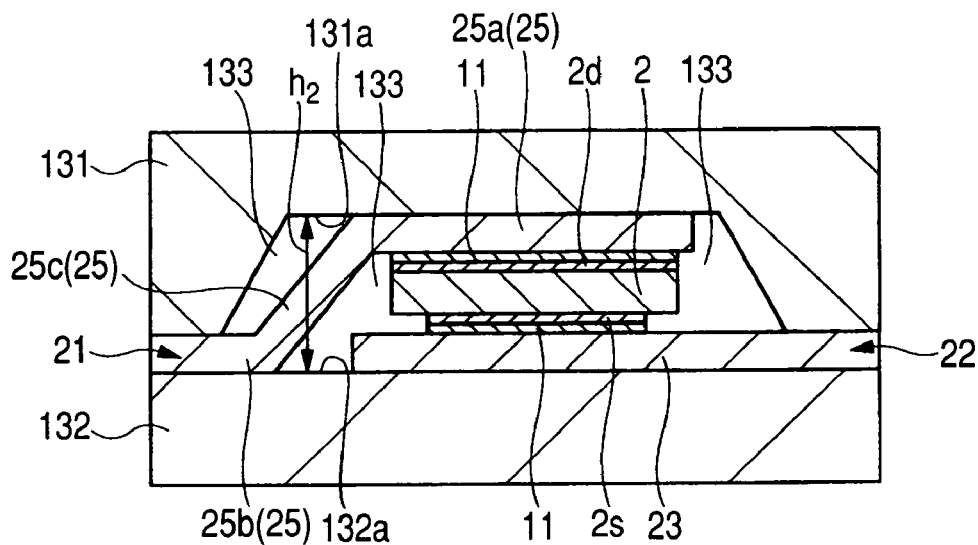
FIG. 19 is an explanatory diagram of a molding process as a comparative example.
Figure 20:
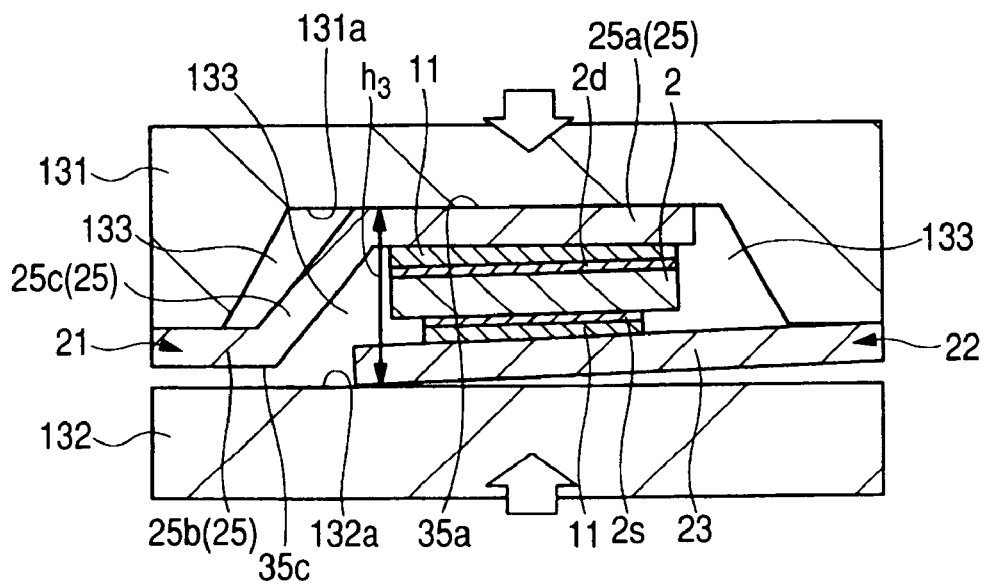
FIG. 20 is an explanatory diagram of the comparative molding process.
Figure 21:
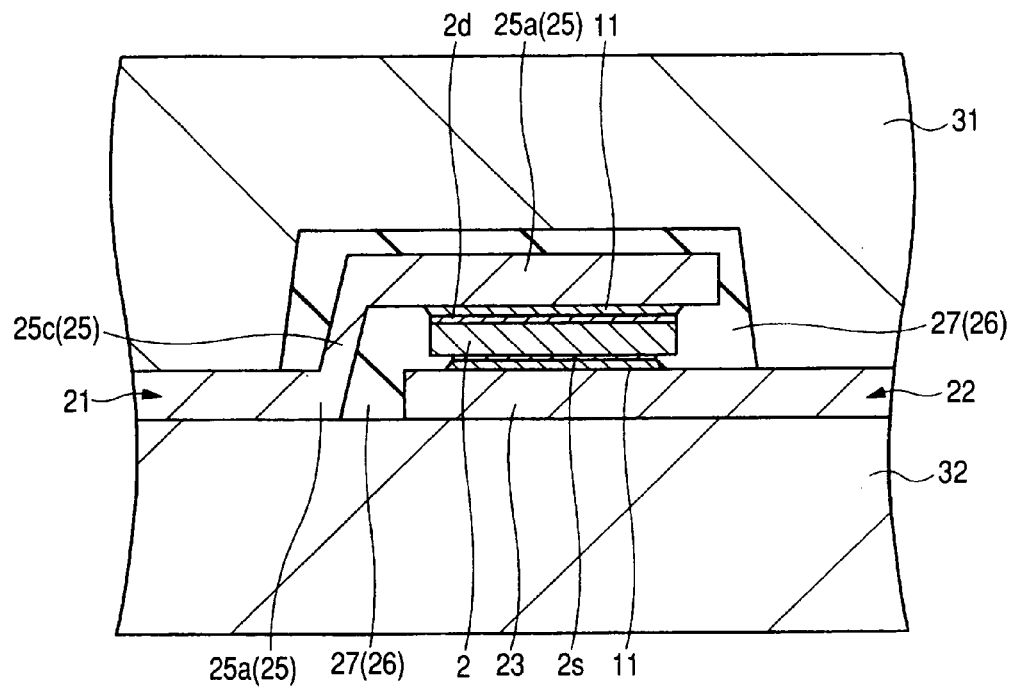
FIG. 21 is a sectional view of the semiconductor device in a semiconductor device manufacturing step which follows FIG. 18.
Figure 22:
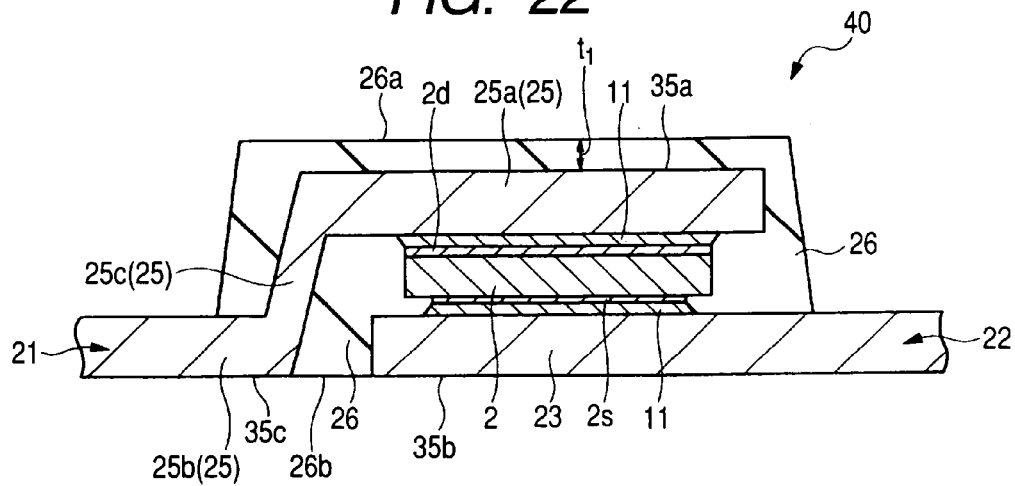
FIG. 22 is a sectional view of the semiconductor device in a semiconductor device manufacturing step which follows FIG. 21.
Figure 23:
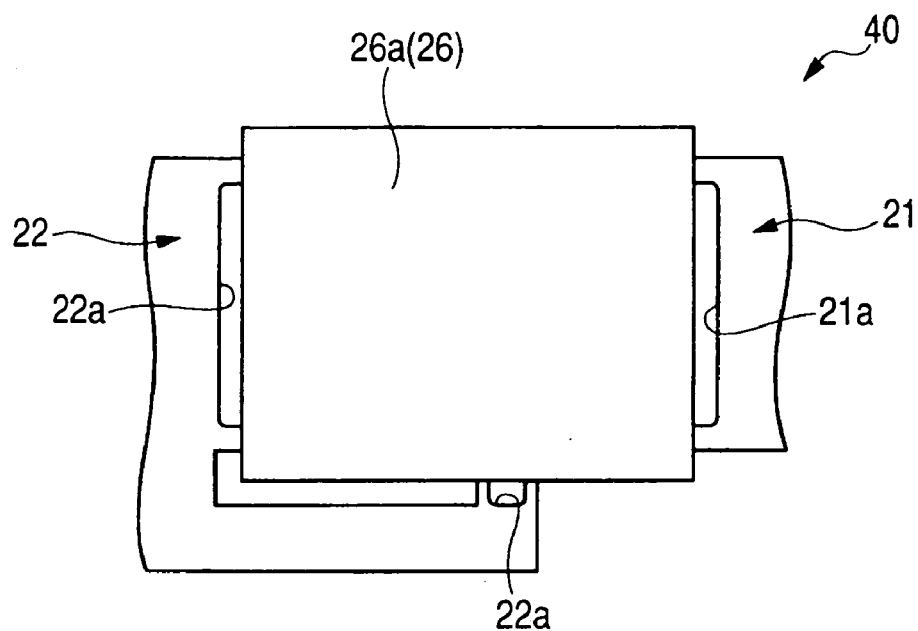
FIG. 23 is a plan view of the semiconductor device in the same semiconductor device manufacturing step as FIG. 22.
Figure 24:
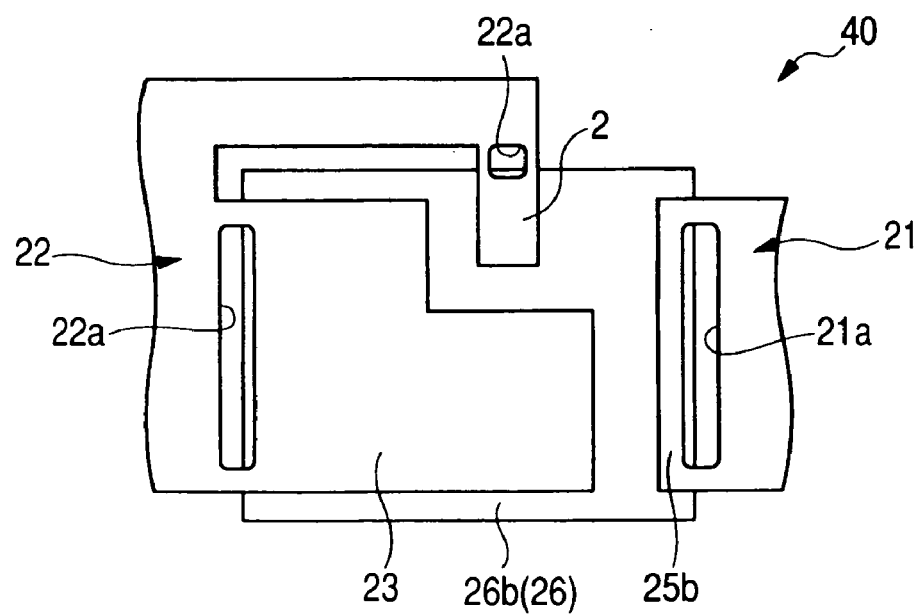
FIG. 24 is a plan view of the semiconductor device in the same semiconductor device manufacturing step as FIG. 22.

Next, a description will be given about a manufacturing process for the semiconductor device according to this embodiment. FIG. 8 is a flow chart showing a manufacturing process for the semiconductor device according to this embodiment. FIGS. 9 and 10 are sectional views of a principal portion of the semiconductor chip 2 used in this embodiment in a semiconductor chip manufacturing process. FIGS. 11 to 22 and FIGS. 25 to 30 are plan views and sectional views of principal portions, showing manufacturing steps for the semiconductor device 1 of this embodiment. Of FIGS. 11 to 18 and FIGS. 22 to 30, FIGS. 11, 13, 15, 23, 24, 27 and 29 are plan views (plan views of principal portions), while FIGS. 12, 14, 16, 17, 18, 21, 22, 25, 26, 28 and 30 are sectional views (sectional views of principal portions). FIGS. 11 and 12, FIGS. 13 and 14, FIGS. 15 and 16, FIGS. 22 to 24, and FIGS. 26 and 27, correspond to the same manufacturing steps, respectively. The sectional views of FIGS. 12, 14, 16, 17, 18, 21, 22, 25, 26, 28 and 30 each correspond approximately to a section taken along line C-C in FIGS. 11, 13 and 15 and are substantially equal to FIG. 4. FIGS. 11, 13, 15, 24 and 29 are plan views on the same side, while FIGS. 23 and 27 are opposite-side (vertically opposite) plan views. FIGS. 19 and 20 are explanatory diagrams (sectional views of a principal portion) of a molding process as a comparative example which the present inventors have studied.

For manufacturing the semiconductor device 1, first a semiconductor chip 1 and lead frames (conductor members) 21 and 22 are provided (step S1).

An example of a manufacturing process for the semiconductor chip 2 will be described below with reference to FIGS. 9 and 10.

For manufacturing the semiconductor chip 2, first, as shown in FIG. 9, an epitaxial layer 101*b* of n⁻ type single crystal silicon is allowed to grow on a main surface of a semiconductor substrate (semiconductor wafer) 101*a* of, for example, n⁺ type single crystal silicon with for example arsenic (As) introduced therein to form a semiconductor substrate (semiconductor wafer or a so-called epitaxial wafer) 101. Thereafter, an insulating film (silicon oxide film) is formed on a main surface of the semiconductor substrate 101 and is then subjected to patterning to form an insulating film 102 (SiO$_2$ plate)

Next, a p-type well 103 is formed, for example, by ion-implanting a p-type impurity (e.g., boron (B)) into the main surface of the semiconductor substrate 101.

Then, the semiconductor substrate 101 is subjected to dry etching with use of a photoresist pattern (not shown) as an etching mask to form a trench for forming a trench gate, i.e., a trench 104 for gate. The trench 104 for gate is deeper than the p-type well 103 and shallower than the bottom of the epitaxial layer 101*b*.

Next, using a thermal oxidation method for example, a relatively thin gate insulating film (silicon oxide film) 105 is formed on inner wall surfaces (side and bottom surfaces) of the trench 104 for gate.

Then, a conductor film (gate electrode material film), e.g., polycrystalline silicon film of a low resistance, is formed on the main surface of the semiconductor substrate 101. Thereafter, such a photoresist pattern (not shown) as covers a gate wiring-forming region and allows the other region to be exposed is formed on the aforesaid conductor film and the conductor film is etched back using the photoresist pattern as an etching mask to form a gate portion 106 of for example a polycrystalline silicon of a low resistance buried into the trench 104 for gate and also form a gate wiring portion 106*a* integral with the gate portion 106.

Next, as shown in FIG. 10, a channel region 107 is formed for example by ion-implanting a p-type impurity (e.g., boron (B)) into the main surface of the semiconductor substrate 101. Thereafter, a source region 108 is formed for example by ion-implanting an n-type impurity (e.g., arsenic (As)) into the main surface of the semiconductor wafer 101.

Then, an insulating film 112 is formed on the main surface of the semiconductor substrate 101, followed by patterning with use of the photolithography or etching technique. At this time, in the insulating film 112 are formed-contact holes 113 to which the main surface of the semiconductor substrate 101 is exposed and are also formed through holes 114 to which a part of the gate wiring portion 106*a* is exposed.

Next, the semiconductor substrate 101 exposed from the contact holes 113 is etched to form holes 115. Subsequently, for example, a p-type impurity (e.g., boron (B)) is ion-implanted into the semiconductor substrate 101 exposed from the contact holes 113 and holes 115 to form a p⁺ type semiconductor region.

Then, for example a titanium-tungsten film (not shown) is formed if necessary onto the main surface of the semiconductor substrate 101 and thereafter an aluminum film (or an aluminum alloy film 116 is formed thereon by a sputtering method for example. Subsequently, the laminate film of both titanium-tungsten film and aluminum film 116 is subjected to patterning with use of both photolithography and etching techniques. As a result, there are formed such surface electrodes as a gate electrode 116*a* and a source wiring 116*b*.

Next, an insulating film (protective film) 117 for surface protection is formed on the main surface of the semiconductor substrate 101 with use of a polyimide resin for example. Thereafter, the insulating film 117 is subjected to patterning with use of both photolithography and etching techniques to form apertures (not shown) to which the gate electrode 116*a* and the source wiring 116*b* are partially exposed. In this way there are formed bonding pads. The gate electrode 116*a* exposed from an aperture formed in the insulating film 117 serves as the gate pad electrode 2*g* of the semiconductor chip 2 and the source wiring 116*b* exposed from an aperture formed in the insulating film 117 serves as the source pad electrode 2*s*.

Then, a back surface of the semiconductor substrate 101 is thinned by grinding or polishing. Thereafter, for example, nickel, titanium, or nickel and gold, are deposited onto the back surface of the semiconductor substrate 101 by vapor deposition for example to form a drain electrode 118. The drain electrode 118 serves as the back-surface drain electrode 2d of the semiconductor chip 2.

In this way a semiconductor element such as a vertical power MISFET having a trench gate structure is formed on the semiconductor substrate 101.

Thereafter, the semiconductor substrate 101 is cut or diced using a dicing saw or the like and is thereby separated into individual semiconductor chips 2. In this way there is fabricated a semiconductor chip 2 formed with the vertical power MISFET having a trench gate structure. The vertical MISFET corresponds to a MISFET wherein the source-drain current flows in the thickness direction (nearly perpendicular to the main surface of the semiconductor substrate) of the semiconductor substrate.

Figure 11:
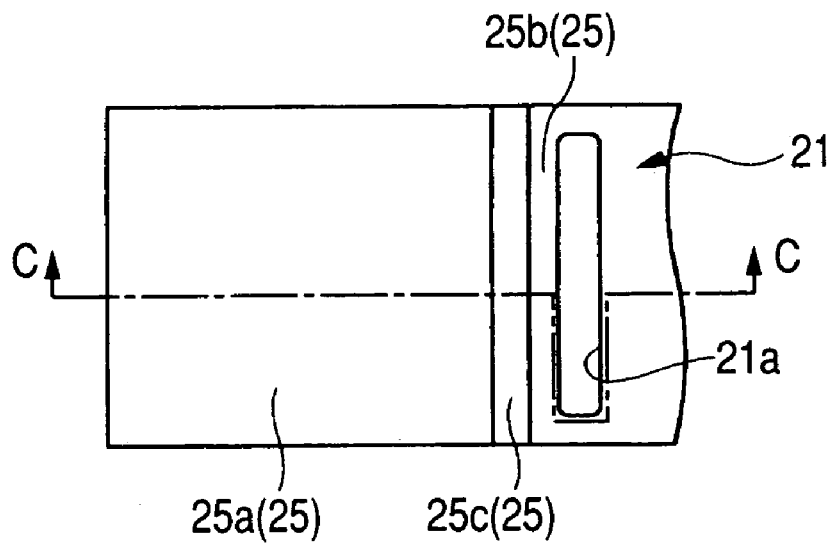
FIG. 11 is a plan view of the semiconductor device embodying the present invention in a semiconductor manufacturing step.
Figure 12:
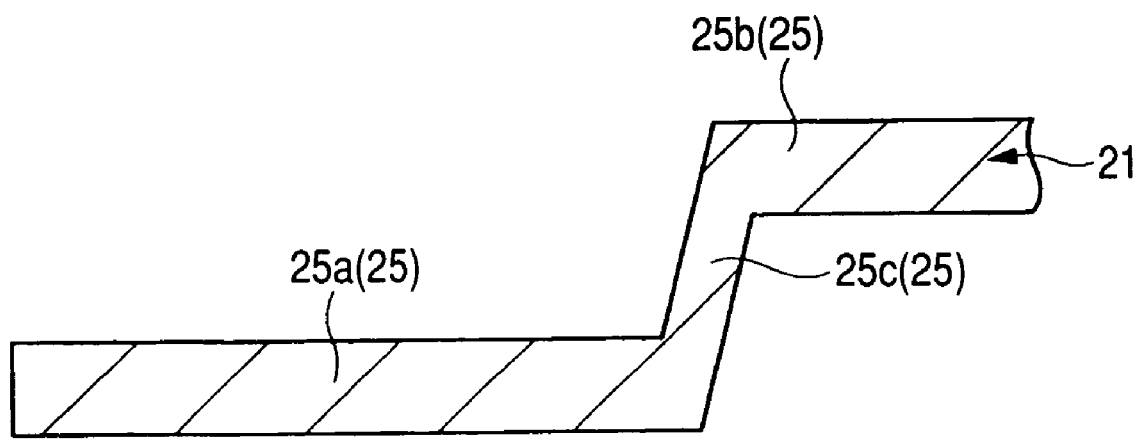
FIG. 12 is a sectional view of the semiconductor device in the same semiconductor device manufacturing step as FIG. 11.

The lead frames 21 and 22 used in manufacturing the semiconductor device 1 are conductor members formed of a metallic members such as, for example, copper (Cu) or copper alloy. As shown in FIGS. 11 and 12, the lead frame (first conductor member) 21 has a drain terminal portion (first conductor portion) 25 serving as the drain terminal 5. More specifically, the lead frame 21 includes a first portion 25a of the drain terminal portion 25 serving as the first portion 5a of the drain terminal 5, a second portion 25b of the drain terminal portion 25 serving as the second portion 5b of the drain terminal 5, and a stepped portion (bent portion) 25c of the drain terminal portion 25 serving as the stepped portion (bent portion) 5c of the drain terminal 5. These portions are formed integrally. The lead frame (second conductor member) 22 includes a source terminal portion (second conductor portion) 23 serving as the source terminal 3 and a gate terminal portion (second conductor portion) 24 serving as the gate terminal 4. These portions are formed integrally. In the lead frames 21 and 22 are formed apertures 21a and 22a along predetermined cutting positions in order to facilitate cutting of the lead frames 21 and 22 which will be described later. The lead frames 21 and 22 can each be fabricated by forming, for example pressing or etching, a metallic plate (e.g., copper plate) into a predetermined shape.

Figure 13:
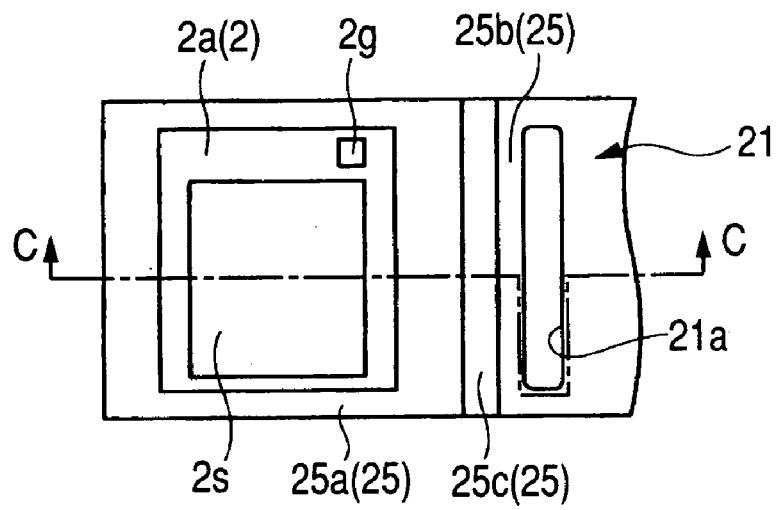
FIG. 13 is a plan view of the semiconductor device in a semiconductor device manufacturing step which follows FIG. 11.
Figure 14:
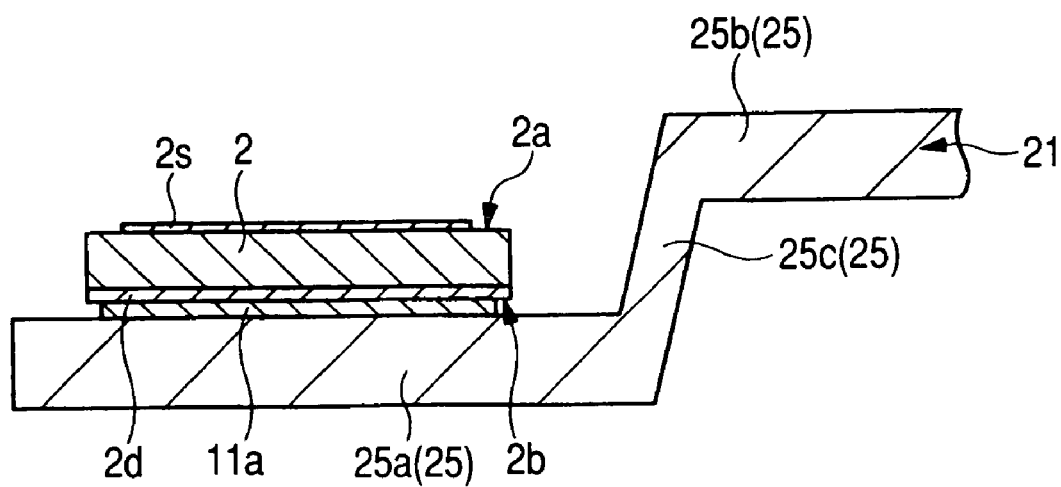
FIG. 14 is a sectional view of the semiconductor device in the same semiconductor device manufacturing step as FIG. 13.

After the semiconductor chip 2 and the lead frames 21 and 22 have been provided, the semiconductor chip 2 is disposed onto the lead frame 21 through solder paste 11a or the like (step S2), as shown in FIGS. 13 and 14. In this case, the semiconductor chip 2 is disposed onto the first portion 25a of the lead frame 21 in such a manner that the surface 2a of the semiconductor chip 2 faces upward and the back surface 2b of the semiconductor chip is opposed to the first portion 25a of the lead frame 21. That is, the semiconductor chip 2 is disposed onto the lead frame 2 so that the semiconductor chip (the back-surface drain electrode 2d thereof) is positioned on the first portion 25a of the drain terminal portion 25 of the lead frame 21 through the solder paste 11a or the like. The semiconductor chip 2 is temporarily fixed to the lead frame 21 with the adhesion of the solder paste 11a.

Figure 15:
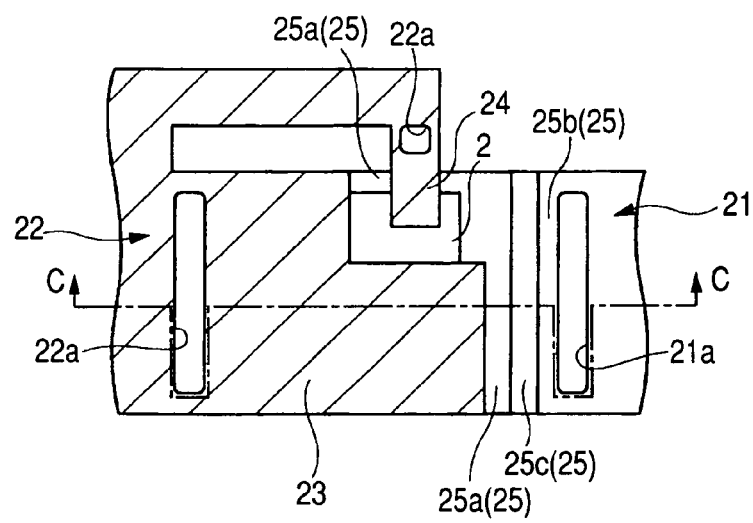
FIG. 15 is a plan view of the semiconductor device in a semiconductor device manufacturing step which follows FIG. 13.
Figure 16:
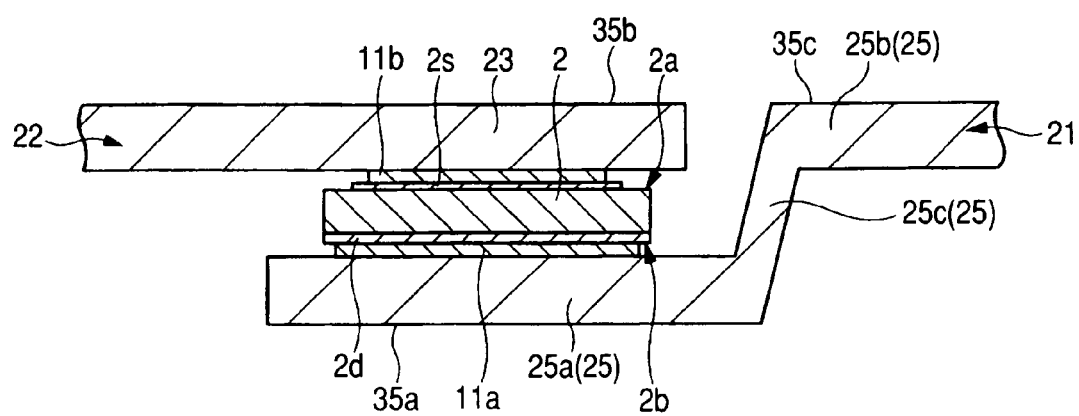
FIG. 16 is a sectional view of the semiconductor device in the same semiconductor device manufacturing step as FIG. 15.

Next, as shown in FIGS. 14 and 15, the lead frame 22 is disposed onto the surface 2a of the semiconductor chip 2 through solder paste 11b or the like (step S3). That is, the lead frame 22 is disposed onto the lead fame 21 and the semiconductor chip 2 in such a manner that the source terminal portion 23 of the lead frame 22 is disposed onto the source pad electrode 2s of the semiconductor chip 2 through the solder paste 11b or the like and that the gate terminal portion 24 of the lead frame 22 is disposed onto the gate pad electrode 2g of the semiconductor chip 2 through the solder paste 11b or the like. The lead frame 22 is temporarily fixed to the semiconductor chip 2 with the adhesion of the solder paste 11b. Although FIG. 15 is a plan view, the lead frame 22 is hatched to make the drawing easier to see.

Figure 17:
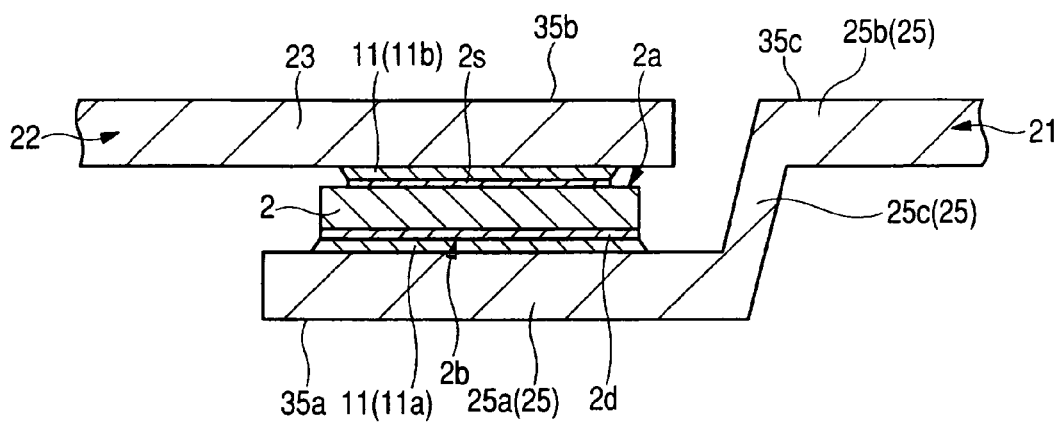
FIG. 17 is a sectional view of the semiconductor device in a semiconductor device manufacturing step which follows FIG. 16.

Then, solder reflow is performed (step S4). In the solder reflow process of step S4, the solder pastes 11a and 11b melt and solidify and, as shown in FIG. 17, the source terminal portion 23 of the lead frame 22 and the source pad electrode 2s of the semiconductor chip 2 are joined and electrically connected with each other through the bonding material 11, the terminal portion 24 of the lead frame 22 and the gate pad electrode 2g of the semiconductor chip 2 are joined and electrically connected with each other through the bonding material 11, and the back-surface drain electrode 2d of the semiconductor chip 2 and the drain terminal portion 25 of the lead frame 21 are joined and electrically connected with each other through the bonding material 11. The solder pastes 11a and 11b melted and solidified by solder reflow serve as the bonding material (solder) 11. The solder reflow process of step S4 may be followed by washing if necessary to remove flux, etc. The solder pastes 11a and 11b may be substituted by silver paste.

In this way, through the bonding material 11, the source terminal portion 23 of the lead frame 22 is joined to the source pad electrode 2s on the surface 2a of the semiconductor chip 2, the gate terminal portion 24 of the lead frame 22 is joined to the gate pad electrode 2g on the surface 2a of the semiconductor chip 2, and the drain terminal portion 25 of the lead frame 21 is joined to the back-surface drain electrode 2d on the back surface 2b of the semiconductor chip 2.

Subsequently, molding is performed (resin sealing process, e.g., transfer molding process) to form a sealing resin portion 26, thereby sealing the semiconductor chip 2 (step S5).

Figure 18:
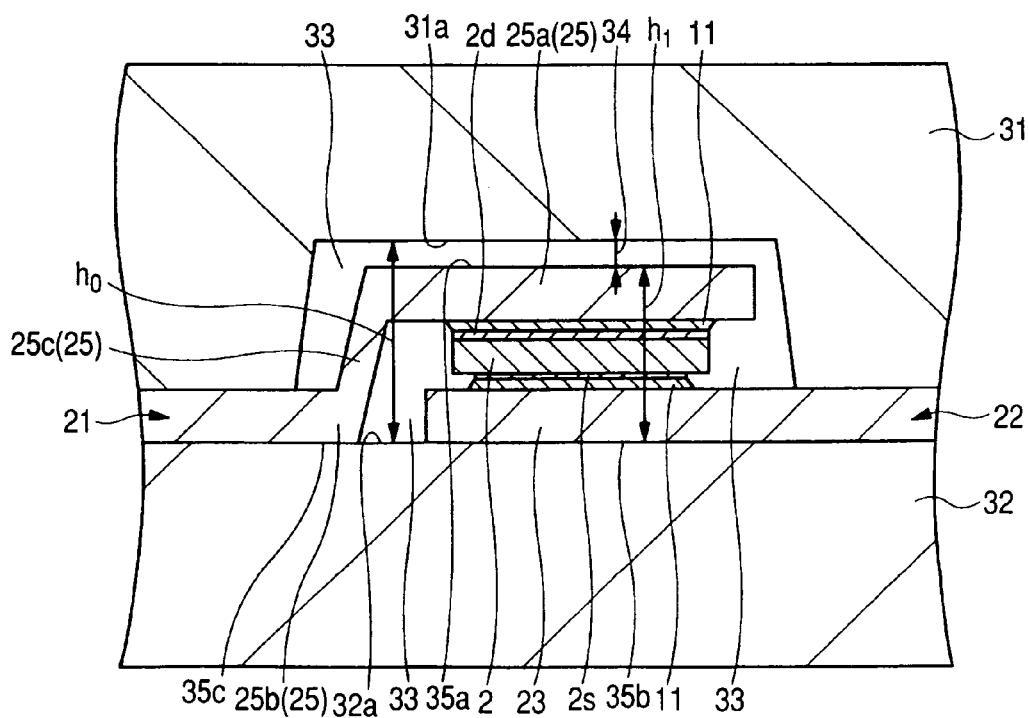
FIG. 18 is a sectional view of the semiconductor device in a semiconductor device manufacturing step which follows FIG. 17.

In FIG. 18 there is shown a state in which the lead frames 21 and 22 are fixed to mold halves 31 and 32 (an upper mold half 31 and a lower mold half 32) in the molding process of step S5 in this embodiment. The lead frames 21 and 22 are fixed to the mold halves 31 and 32 in such a manner that the source terminal portion 23 and gate terminal portion 24 of the lead frame 22, the drain terminal portion 25 of the lead frame 21, and the semiconductor chip 2 located therebetween, are disposed within a cavity 33 defined by both mold halves. Then, a sealing resin material is poured into the cavity 33 and is cured to form a sealing resin portion (sealing resin portion 26 to be described later) which seals the semiconductor chip 2. In the molding process, the lead frames 21, 22 and the semiconductor chip 2 may set to the mold halves 31 and 32 so that the up and down relation in FIG. 18 is reversed to let the back-surface drain electrode 2d of the semiconductor chip 2 faces downward. However, it is preferable that the lead frames 21, 22 and the semiconductor chip 2 be set to the mold halves 31 and 32 as in FIG. 18 in which the back-surface drain electrode 2d of the semiconductor chip 2 faces upward.

In this embodiment, when fixing the lead frames 21 and 22 to the mold halves 31 and 32, as shown in FIG. 18, only the outer periphery portions of the lead frames 21 and 22 are fixed (clamped) and care is taken lest the semiconductor chip 2 should be pressed from both upper and lower sides. That is, the semiconductor chip 2 is disposed within the cavity 33 defined by the mold halves 31 and 32 of the semiconductor chip 2 in a state in which the semiconductor chip is sandwiched (disposed) in between the source and gate terminal portions 23, 24 of the lead frame 22 and the drain terminal portion 25 of the lead frame 21, and the outer periphery portions of the lead frames 21 and 22 are pinched and clamped by the mold halves 31 and 32. At this time, a lower surface 35c of the second portion 25b of the drain terminal portion 25 in the lead frame 21 and a lower surface 35b of the gate and source terminal portions 24, 23 of the lead frame 22 come into contact (close contact) with an upper surface 32a of the mold half (lower mold half) 32, while the first portion 25a (an upper surface 35a thereof) of the drain terminal portion 25 in the lead frame 21 does not come into contact (close contact) with the mold half (upper mold half) 31, forming a gap 34 between the upper surface 35a of the first portion 25a of the drain terminal portion 25 in the lead frame 21 and a lower surface 31a of the mold half 31.

Consequently, a height hi (corresponding to the distance from the upper surface 35a of the first portion 25a of the drain terminal portion 25 to the lower surface 35b of the gate and source terminal portions 24, 23) of the assembly just before the molding process is smaller than a height ho (corresponding to the distance from the lower surface 31a of the mold half 31 to the upper surface 31b of the mold half 32 in a clamped state of both mold halves 31, 32) of the cavity 33 defined by both mold halves, ($h_1$<$h_0$).

The upper surface (surface) 35a of the first portion 25a of the drain terminal portion 25 in the lead frame 21 is a surface located on the side opposite to the side opposed to the back surface 2b of the semiconductor chip 2, i.e., a surface located on the side opposite to the surface to which the semiconductor chip 2 is joined. After the manufacture of the semiconductor device 1, the upper surface 35a of the first portion 25a of the drain terminal portion 25 becomes the upper surface 5e of the first portion 5a of the drain terminal 5 and the lower surface 35c of the second portion 25a of the drain terminal portion 25 in the lead frame 21 becomes the upper surface 5f of the second portion 5b of the drain terminal 5. Likewise, the lower surface (surface) 35b of the gate and source terminal portions 24, 23 of the lead frame 22, which lower surface is a surface located on the side opposite to the side opposed to the surface 2a of the semiconductor chip 2, i.e., a surface located on the side opposite to the surface to which the semiconductor chip 2 is joined, becomes the lower surfaces 4a and 3a of the gate terminal 4 and the source terminal 3 after the manufacture of the semiconductor device 1.

Thus, in this embodiment, the mold halves 31 and 32 are clamped to fix the lead frames 21 and 22 in such a manner that the mold halves do not press the upper surface 35a of the first portion 25a of the drain terminal portion 25 in the lead frame 21.

FIG. 19 shows a state in which the lead frames 21 and 22 with the semiconductor chip 2 held therebetween are fixed to mold halves 131 and 132 in a comparative molding process which the present inventors have studied. In the comparative molding process shown in FIG. 19, the mold halves 131 and 132 are disposed within a cavity 133 defined by both mold halves in a state in which the semiconductor chip 2 is sandwiched in between the source and gate terminal portions 23, 24 of the lead frame 22 and the first portion 25a of the drain terminal portion 25 in the lead frame 21, and at the time of pinching and clamping the lead frames 21 and 22 by the mold halves 131 and 132, the lower surfaces of the source and gate terminal portions 23, 24 of the lead frame 22 and an upper surface 132a of the lower mold half 132 come into contact with each other, and the upper surface of the first portion 25a of the drain terminal portion 25 in the lead frame 21 and a lower surface 131a of the upper mold half 131 also come into contact with each other. If a sealing resin material is poured into the cavity 133 defined by the mold halves 131 and 132 and is cured in the state of FIG. 19, the lower surfaces of the source and gate terminal portions 23, 24 can be exposed to the back surface side of the sealing resin portion and the upper surface of the first portion 25a of the drain terminal portion 25 can be exposed to the upper surface side of the sealing resin portion. However, in the comparative molding process of FIG. 19, when the lead frames 21 and 22 with the semiconductor chip 2 held therebetween are clamped by the mold halves 131 and 132, there is a possibility that pressure may be applied from both upper and lower mold halves 131, 132 to the semiconductor chip 2 through the first portion 25a of the drain terminal portion 25 which overlies the semiconductor chip 2 and the source and gate terminal portions 23, 24 which underlie the semiconductor chip.

FIG. 20 is an explanatory diagram (a sectional view of a principal portion) showing schematically in what state pressures are applied from above and below to the semiconductor chip 2. As shown in FIG. 20, there is a possibility that a height $h_3$ of the assembly just before the molding process may vary or the parallelism between the lower surface 35b of the gate and source terminals 24, 23 of the lead frame 22 and the upper surface of the first portion 25a of the drain terminal portion 25 in the lead frame 21 may vary, for example, due to variations in the state of connection between the semiconductor chip 2 and the lead frames 21, 22 or variations in the amount of the bonding material 11 used. As a result, if the height $h_3$ of the assembly just before the molding process becomes larger ($h_3$>$h_2$) even a little than the height $h_2$ of the cavity 133, the mold half 131 presses the upper surface 35a of the first portion 25a of the drain terminal portion 25 in the lead frame 21 and the mold half 132 presses the lower surface 35b of the gate and source terminal portions 24, 23, of the lead frame 22, with a consequent likelihood that strong pressures may be applied from above and below to the semiconductor chip 2 held between the first portion 25a of the drain terminal portion 25 and the source and gate terminal portions 23, 24. Once pressures are applied from above and below to the semiconductor chip 2, the semiconductor chip is likely to be cracked, leading to a lowering in the production yield of the semiconductor device 1.

On the other hand, in this embodiment, as shown in FIG. 18, only the outer periphery portions of the lead frames 21 and 22 are fixed (clamped) and, although the lower surfaces 35b and 35c of the source and gate terminal portions 23, 24 and the second portion 25b of the drain terminal portion 25 come into contact with the upper surface (lower surface of the cavity) 32a of the lower mold half 32, the first portion 25a of the drain terminal portion 25 in the lead frame 21 and the upper mold half 31 do not contact each other and a gap 34 is formed between the upper surface 35a of the first portion 25a of the drain terminal portion 25 in the lead frame 21 and the lower surface (upper surface of the cavity 33) of the mold half 31. That is, on the upper surface 31a of the cavity 33, the mold half 31 comes into contact with none of the source terminal portion 23, gate terminal portion 24 and drain terminal portion 25. Consequently, the semiconductor chip 2 can be prevented from being pressed from both upper and lower sides when the lead frames 21 and 22 are clamped by the mold halves 31 and 32. Besides, since the gap 34 is present between the upper surface of the first portion 25 of the drain terminal portion 25 in the lead frame 21 and the lower surface of the mold half 31, even if the height hi of the assembly just before the molding process varies or even if the parallelism between the lower surface 35b of the gate and source terminal portions 24, 23 in the lead frame 22 and the upper surface 35a of the first portion 25a of the drain terminal portion 25 in the lead frame 21 varies, the height $h_1$ of the assembly just before the molding process can be kept smaller than the height $h_0$ of the cavity 33 defined by the mold halves 31 and 32 ($h_1 < h_0$) so that it is possible to surely prevent contact between the upper surface 35a of the drain terminal portion 25 of the lead frame 21 and the mold half 31 upon clamping of the mold halves 31 and 32 and hence possible to prevent the semiconductor chip 2 from being pressed from above and below. Consequently, it is possible to prevent cracking or the like of the semiconductor chip 2 in the molding process and hence possible to improve the production yield of the semiconductor device 1.

After the lead frames 21 and 22 are clamped by the mold halves 31 and 32 as shown in FIG. 18, a sealing resin material 27 as the material for forming the sealing resin portion 26 is poured (introduced or filled) into the cavity 33 defined by both molding halves 31 and 32 and is cured to form the sealing resin portion 26. The sealing resin material for forming the sealing resin portion 26 is, for example, a thermosetting resin and may contain fillers or the like. For example, there may be used a filler-containing epoxy resin.

After the sealing resin portion 26 has been formed by curing of the sealing resin material 27, the sealing resin portion 26 and the lead frames 21, 22 are released from the mold halves 31 and 32, whereby there is obtained an assembly (work) 40. The sealing resin portion 26 thus formed has an upper surface (surface) 26a and a back surface (bottom or lower surface) 36b as two main surfaces positioned on mutually opposite sides. The upper surface 26a of the sealing resin portion 26 is a surface (main surface) corresponding to the upper surface 6a of the sealing resin portion 6 described previously and the back surface 26b of the sealing resin portion 26 is a surface (main surface) corresponding to the back surface 6b of the sealing resin portion 6 described previously. In the assembly 40, the sealing resin portion 26 seals the semiconductor chip 2, source terminal portion 23, gate terminal portion 24 and drain terminal portion 25.

As described above, since the sealing resin material 27 is poured into the cavity 33 defined by the mold halves 31 and 32 in a state in which the first portion 25a of the drain terminal portion 25 in the lead frame 21 and the mold half 31 do not contact each other and the gap 34 is present between the two, the sealing resin material 27 is filled also into the gap 34 present between the first portion 25a and the mold half 31. Therefore, the sealing resin portion 26 formed by the cured sealing resin material 27 not only seals the semiconductor chip 2 in the interior thereof but also covers the upper surface 35a of the first portion 25a of the drain terminal portion 25 in the lead frame 21 and thus none of the terminal portions (source, gate and drain terminal portions 23, 24, 25) are exposed to the upper surface 26a of the sealing resin portion 26. That is, the sealing resin portion 26 is formed also on the upper surface 35a of the first portion 25a of the drain terminal portion 25 in the lead frame 21, the first portion 25a is sealed in the interior of the sealing resin portion 26, and the upper surface 35a is not exposed from the sealing resin portion 26. Thus, in the molding process of step s5, the sealing resin portion 26 is formed so as to cover the upper surface 35a of the first portion 25a of the drain terminal portion 25 in the lead frame 21.

On the other hand, the sealing resin material 27 is not filled between the lower surface 35b of the gate and source terminal portions 24, 23 of the lead frame 22 and the upper surface of the mold half 32 because there is no gap between the two. No gap is present, either, between the lower surface 35c of the second portion 25b of the drain terminal portion 25 and the upper surface 32a of the mold half 32 and therefore the sealing resin material is not filled between the two. Thus, the sealing resin material 26 is hardly formed on the lower surface 35b of the gate and source terminal portions 24, 23 in the lead frame 22 and the lower surface 35c of the second portion 25b of the drain terminal portion 25 in the lead frame 21, which lower surfaces are exposed from the back surface 26b of the sealing resin portion 26.

Accordingly, in the sealing resin portion 26 formed in the molding process of step S5, conductor portions (the source terminal portion 23 and the gate terminal portion 24) are exposed to only the back surface 26b out of the surface 26a and the back surface 26b.

As to the sealing resin portion 26 formed in the molding process of step S5, it is preferable that thickness $t_1$ of the sealing resin portion 26 on the upper surface 35a of the first portion 25a of the drain terminal portion 25 in the lead frame 21 be, for example, 50 μm or more ($t_1 \geq 50$ μm). If the thickness $t_1$ is too small, there arises a possibility that pressures may be applied to the semiconductor chip 2 from the upper and lower mold halves 31, 32 through the first portion 25a of the drain terminal portion 25 located on the upper side and the source and gate terminal portions 23, 24 located on the lower side when the lead frames 21 and 22 are clamped by the mold halves 31 and 32, due to variations in height $h_1$ of the assembly just before the molding process and variations in parallelism between the lower surface 35a of the gate and source terminal portions 24, 23 in the lead frame 22 and the upper surface 35a of the first portion 25a of the drain terminal portion 24 in the lead frame 21. By forming the sealing resin portion 26 so that the thickness $t_1$ thereof on the upper surface 35a of the first portion 25a of the drain terminal portion 25 becomes 50 μm or more ($t_1 \geq 50$ μm), pressures can be prevented more completely from being applied to the semiconductor chip 2 from above and below in the molding process of step S5 even under variations in height $h_1$ of the assembly just before the molding process or variations in parallelism between the lower surface 35b of the gate and source terminal portions 24, 23 in the lead frame 22 and the upper surface 35a of the first portion 25a of the drain terminal portion 25 in the lead frame 21, thus making it possible to further improve the production yield of the semiconductor device 1.

It is more preferable that the thickness $t_1$ of the sealing resin portion 26 formed in the molding process of step S5 be, for example, 100 μm or less ($t_1 \leq 100$ μm) on the upper surface 35a of the first portion 25a of the drain terminal portion 25 in the lead frame 21. If this thickness $t_1$ is too large, the amount of the sealing resin portion 26 polished in a polishing process for the sealing resin portion 26 which will be described later becomes larger and the time required for the polishing process becomes longer, with a consequent likelihood of a lowering in throughput of the semiconductor device. By forming the sealing resin portion 26 so that the thickness t, thereof on the first portion 25a of the drain terminal portion 25 becomes 100 μm or less ($t_1 \leq 100$ μm), it is possible to shorten the time required of the polishing process for the sealing resin portion 26 which will be described later and hence possible to improve the throughput of the semiconductor device.

Thus, it is more preferable that the thickness t, of the sealing resin portion 26 formed in the molding process of step S5 be, for example, 50 to 100 μm (50 μm $\leq t_1 \leq$ 100 μm) on the upper surface 35a of the first portion 25a of the drain terminal portion 25 in the lead frame 25.

After formation of the sealing resin portion 26 in the molding process of step S5, the sealing resin portion 26 is polished (step S6). A part of the sealing resin portion 26 is removed by polishing the sealing resin portion.

In the polishing process of step S6 for the sealing resin portion 26, at least the upper surface 26a side of the sealing resin portion 26 is polished. In this case, the sealing resin portion 26 is polished until the upper surface 35a of the first portion 25a of the drain terminal portion 25 becomes exposed. More specifically, a part of the sealing resin portion 26, (the sealing resin portion 26 on the upper surface 35a of the first portion 25a of the drain terminal portion 25) is removed by polishing so that the upper surface (surface) 35a of the first portion 25a of the drain terminal portion 25 (first conductor portion) is exposed from the sealing resin portion 26.

Figure 25:
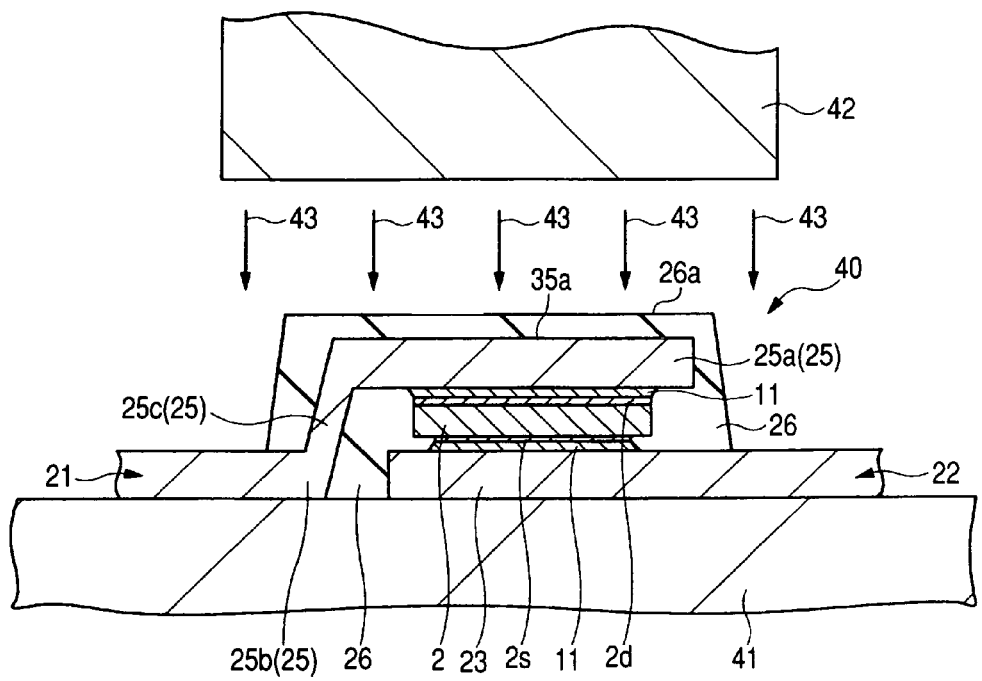
FIG. 25 is a sectional view of the semiconductor device in a semiconductor device manufacturing step which follows FIG. 22.

FIG. 25 is an explanatory diagram of the polishing process of step S6 for the sealing resin portion 26 in this embodiment.

In this embodiment, the polishing process of step S6 for the sealing resin portion 26 is carried out by liquid honing. According to the liquid honing method, liquid such as water and particles (a granular or powdered abrasive) are mixed together and the resulting mixture (liquid mixed with or containing grains) is sprayed (ejected or jetted) at a high pressure to a surface to be polished (the upper surface 26a of the sealing resin portion 26 in this embodiment). As the grains (abrasive) mixed in the liquid (water) there may be used fine abrasive grains, e.g., fine grains of alumina (aluminum oxide).

For example, the polishing of the upper surface 26a of the sealing resin portion 26 in the polishing process of step S6 for the sealing resin portion 26 can be performed in the following manner. First, the assembly (work) 40 which has been formed with the sealing resin portion 26 in step S5 is placed on a conveyor rail 41 as shown in FIG. 25. With movement of the conveyor rail 41, the assembly 40 moves as well. When the assembly 40 arrives at a position under a nozzle (ejection nozzle), a water-alumina mixture 43 or the like is sprayed at a high pressure (e.g., 0.2 MPa or so) to the upper surface 26a of the sealing resin portion 26 from the nozzle 42 located at an upper position. Although in FIG. 25 the mixture 43 is indicated schematically in terms of arrows to simplify the illustration, the mixture 43 (liquid with an abrasive such as alumina mixed therein) is sprayed uniformly to the upper surface 26a of the sealing resin portion 26 from the nozzle 42.

As the liquid (mixture 43) with an abrasive such as alumina mixed therein is sprayed at a high pressure to the upper surface 26a of the sealing resin portion 26, the upper surface 26a of the sealing resin portion 26 is polished. After the upper surface 26a of the sealing resin portion 26 has been polished by spraying the mixture (liquid with an abrasive such as alumina mixed therein) from the nozzle 42 to the upper surface 26a of the sealing resin portion 26 for a predetermined period of time (for example, 20 to 30 seconds or so), allowing the first portion 25a of the drain terminal portion 25 to be exposed from the sealing resin portion 26 (the upper surface thereof), the spraying of the mixture 43 from the nozzle 42 is stopped. By this liquid-honing for the upper surface 26a of the sealing resin portion 26, the sealing resin portion 26 present on the upper surface 35a of the first portion 25a of the drain terminal portion 25 is removed and the first portion 25a of the drain terminal portion 25 is exposed from the sealing resin portion 26, affording the structure shown in FIGS. 26 and 27.

In the polishing process (step S6) for the sealing resin portion 26, since the sealing resin portion is polished by liquid honing, the source, gate and drain terminal portions 23, 24, 25 of the lead frames 21 and 22 can be prevented from being polished in this polishing process. More particularly, the lead frames 21 and 22 including the source, gate and drain terminal portions 23, 24, 25 are formed of a metallic material such as copper (Cu) or copper alloy and are therefore harder than the sealing resin portion 26 formed of a resin material which may contain fillers. Consequently, only the sealing resin portion 26 can be polished and removed selectively without polishing (removing) the source, gate and drain terminal portions 23, 24, 25 of the lead frames 21 and 22. Besides, by adjusting the type, diameter and content (proportion) of the abrasive grains contained in the mixture 43 to be sprayed to the sealing resin portion 26 from the nozzle 42 and adjusting the spraying pressure, only the sealing resin portion 26 can be polished and removed more completely without polishing (removing) the source, gate and drain terminal portions 23, 24, 25 of the lead frames 21 and 22. Moreover, since the sealing resin portion 26 is polished by liquid honing, the semiconductor chip 2 can be prevented from being stressed or damaged during the polishing work. Likewise, since the polishing of the sealing resin portion 26 is performed by liquid honing, the source, gate and drain terminal portions 23, 24, 25 are not polished and it is possible to prevent the occurrence of variations in size of the external terminals (source terminal 3, gate terminal 4 and the second portion 5b of the drain terminal 5) of the semiconductor device 1.

The polishing of the upper surface 26a of the sealing resin portion 26 is performed until at least the upper surface 35a of the first portion 25a of the drain terminal portion 25 becomes exposed from the sealing resin portion 26. In this connection, it is preferable that the polishing of the upper surface side of the sealing resin portion 26 be continued even after exposure of the upper surface 35a of the first portion 25a of the drain terminal portion 25 from the sealing resin portion 26 to polish and remove the sealing resin portion 26 to a somewhat excessive degree. As a result, after the polishing, the upper surface 26c of the sealing resin portion 26 and the upper surface 35a of the first portion 25a of the drain terminal portion 25 are not flush with each other, but the latter assumes a somewhat projecting state from the former after polishing. It is preferable that the amount of projection $h_4$ of the upper surface 35a of the first portion 25a of the drain terminal portion 25 from the upper surface 26c of the sealing resin portion 26 after polishing, (i.e., the difference $h_4$ between the height position of the upper surface 35a and the upper surface 26c after polishing), be 30 μm or more ($h_4 \geq 30$ μm). For example, the amount of projection $h_4$ may be set at about 50 μm. Such a structure can be attained by polishing the upper surface 26a of the sealing resin portion 26 with use of liquid honing which permits polishing of the sealing resin portion 26 without polishing the drain terminal portion 25.

In the molding process of step 5, as shown in FIG. 18, the sealing resin material 27 is poured into the cavity 33 to form the sealing resin portion 26 in a state in which the lower surface 35b of the gate and source terminal portions 24, 23 in the lead frame 22 and the lower surface 35c of the second portion 25b of the drain terminal portion 25 in the lead frame 21 are in contact (close contact) with the upper surface 32a of the mold half 32 which constitutes the bottom of the cavity 33, thereby preventing the sealing resin portion 26 from being formed on both lower surfaces 35b and 35c. However, there is a possibility that burrs or the like be formed in these regions. To avoid such a possibility, it is preferable that not only the upper surface 26a but also a back surface 26b (a surface opposite to the upper surface 26a) of the sealing resin portion 26 be polished in step S6 to remove burrs on the lower surfaces 35b and 35c of the source terminal portion 23, the gate terminal portion 24 and the second portion 25b of the drain terminal portion 25. It is preferable to use liquid honing also for polishing the back surface 26b of the sealing resin portion 26. For example, the liquid honing may be performed in a state in which the assembly 40 is turned upside down and placed on the conveyor rail 41 in FIG. 25.

When polishing the back surface 26b of the sealing resin portion 26 by liquid honing, it is preferable that not only the burr present on the back surface 26b side of the sealing resin portion 26 be removed but also the polishing by liquid honing of the back surface 26b side of the sealing resin portion 26 be continued to polish and remove the sealing resin portion 26 to a somewhat excessive degree even after complete exposure of the lower surfaces 35b and 35c of the source terminal portion 23, gate terminal portion 24 and the second portion 25b of the drain terminal portion 25 from the back surface 26b of the sealing resin portion 26. As a result, the lower surfaces 35b and 35c of the source and gate terminal portions 23, 24 and the second portion 25b of the drain terminal portion 25 are not flush with a back surface 26d (a surface opposite to the upper surface 26a) of the sealing resin portion 26 after polishing, but the lower surfaces 35b and 35c assume a somewhat projecting state from the back surface 26d after polishing. It is preferable that the amount of projection $h_5$ of the lower surfaces 35b and 35c of the source terminal portion 23, gate terminal portion 24 and the second portion 25b of the drain terminal portion 25 from the back surface 26d of the sealing resin portion 26 after polishing, (i.e., the difference $h_5$ between the height position of the lower surfaces 35b and 35c of the gate and drain terminal portions 24, 25 and the height position of the back surface 26d of the sealing resin portion 26), be 30 μm or more ($h_5 \geq 30$ μm). For example, the amount of projection $h_5$ may be set at about 50 μm. Such a structure can be attained by polishing the back surface 26b of the sealing resin portion 26 with use of liquid honing which permits polishing of the sealing resin portion 26 without polishing the source, gate and drain terminal portions 23, 24, 25.

However, since the polishing (liquid honing) of the upper surface 26a of the sealing resin portion 26 is performed mainly for removing the sealing resin portion 26 which covers the first portion 25a of the drain terminal portion 25 from above and the polishing (liquid honing) of the back surface 26b of the sealing resin portion 26 is performed mainly for deburring and for projection of terminals (for ensuring the amount of projection $h_5$), the amount of the sealing resin portion 26 polished on its upper surface 26a side is larger than that polished on its back surface 26b side. The amount of the sealing resin 26 polished becomes larger by prolonging the liquid honing time (spraying time of the mixture 43 to the sealing resin portion 26 from the nozzle 42) or by increasing the liquid honing pressure (spraying pressure of the mixture 43 to the sealing resin portion 26 from the nozzle 42). For example, therefore, the liquid honing time in polishing the upper surface 26a of the sealing resin portion 26, (the liquid honing time for the sealing resin portion 26), is set longer than the liquid honing time in polishing the back surface 26b of the sealing resin portion. Alternatively, the liquid honing pressure in polishing the upper surface 26a of the sealing resin portion 26, (the liquid honing pressure for the sealing resin portion 26), is set higher than the liquid honing pressure in polishing the back surface 26b of the sealing resin portion. As a result, the amount of the upper surface 26a of the sealing resin portion 26 polished can be made larger than that of the back surface 26b of the sealing resin portion polished.

The polishing process of step S6 for the sealing resin portion 26 is followed by a plating process if necessary to form a plating layer (not shown) on the portions (conductor portions) of the lead frames 21 and 22 exposed from the sealing resin portion 26. For example, solder plating may be conducted using a lead-free solder.

Figure 30:
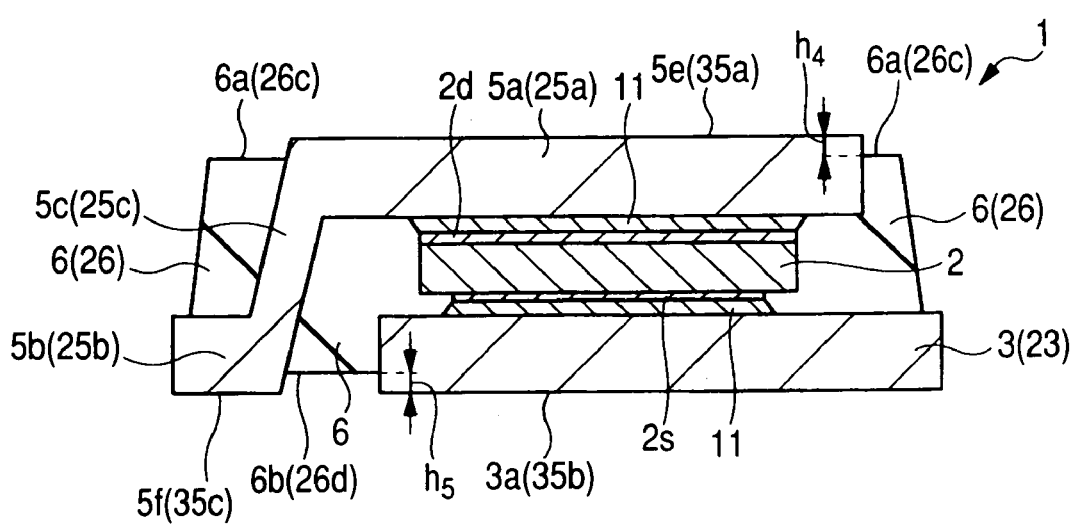
FIG. 30 is a sectional view of the semiconductor device in a semiconductor device manufacturing step which follows FIG. 29.

Next, the lead frames 21 and 22 are cut in predetermined positions (step S8). For example, the lead frames 21 and 22 are cut along cutting lines 45 indicated by dotted lines in FIG. 27 to remove the lead frames 21 and 22 projecting from the sealing resin portion 26. In this way there is obtained (produced) each individually divided semiconductor device 1 as shown in FIG. 30. The semiconductor device 1 shown in FIG. 30 corresponds to the semiconductor device 1 shown in FIGS. 1 to 5.

The sealing resin portion 26 (after polishing) becomes the sealing resin portion 6 in the semiconductor device 1. The upper surface 26c and the back surface 26d after polishing the sealing resin portion 26 by liquid honing correspond to the surface (upper surface) 6a and the back surface 6b, respectively, of the sealing resin portion 6. The source terminal portion 23 and the gate terminal portion 24 cut off from the lead frame 22 become the source terminal 3 and the gate terminal 4, respectively, in the semiconductor device 1. Likewise, the drain terminal portion 25 cut off from the lead frame 21 becomes the drain terminal 5 in the semiconductor device 1. The first and second portions 25a, 25b of the drain terminal portion 25 become the first and second portions 5a, 5b, respectively, of the drain terminal 5. Likewise, the stepped portion 25c of the drain terminal portion 25 becomes the stepped portion 5c of the drain terminal 5. The upper surface 35a of the first portion 25a of the drain terminal portion 25 exposed from the upper surface 26c after polishing of the sealing resin portion 26 becomes the upper surface 5e of the first portion 5a of the drain terminal 5 exposed from the upper surface 6a of the sealing resin portion 6. The lower surface 35b of the source terminal portion 23 exposed from the back surface 26b after polishing of the sealing resin portion 26 becomes the lower surface 3a of the source terminal 3 exposed from the back surface 6b of the sealing resin portion 6. The lower surface of the gate terminal portion 24 becomes the lower surface 4a of the gate terminal 4 exposed from the back surface 6b of the sealing resin portion 6. Further, the lower surface 35c of the second portion 25b of the drain terminal portion 25 becomes the lower surface 5f of the second portion 5b of the drain terminal 5 exposed from the back surface 6b of the sealing resin portion 6.

As described above, by polishing the upper surface 26a of the sealing resin portion 26 with use of liquid honing, the upper surface 35a of the first portion 25a of the train terminal portion 25 is projected by the amount of projection $h_4$ from the upper surface 26c of the sealing resin portion 26 after polishing, so that the upper surface 5e of the first portion 5a of the drain terminal 5 in the semiconductor device 1 produced also assumes a projected state by the amount of projection $h_4$. Similarly, by polishing the back surface 26b of the sealing resin portion 26 with use of liquid honing, the lower surfaces 35b and 35c of the source terminal portion 23, gate terminal portion 24 and the second portion 25b of the drain terminal portion 25 assume a projecting state by the amount of projection $h_5$ from the back surface 26d of the sealing resin portion 26 after polishing, so that the lower surfaces 3a, 4a and 5f of the source terminal 3, gate terminal 4 and the second portion 5b of the drain terminal 5, respectively, in the semiconductor device 1 produced also assume a projecting state by the amount of projection $h_5$.

Figure 31:
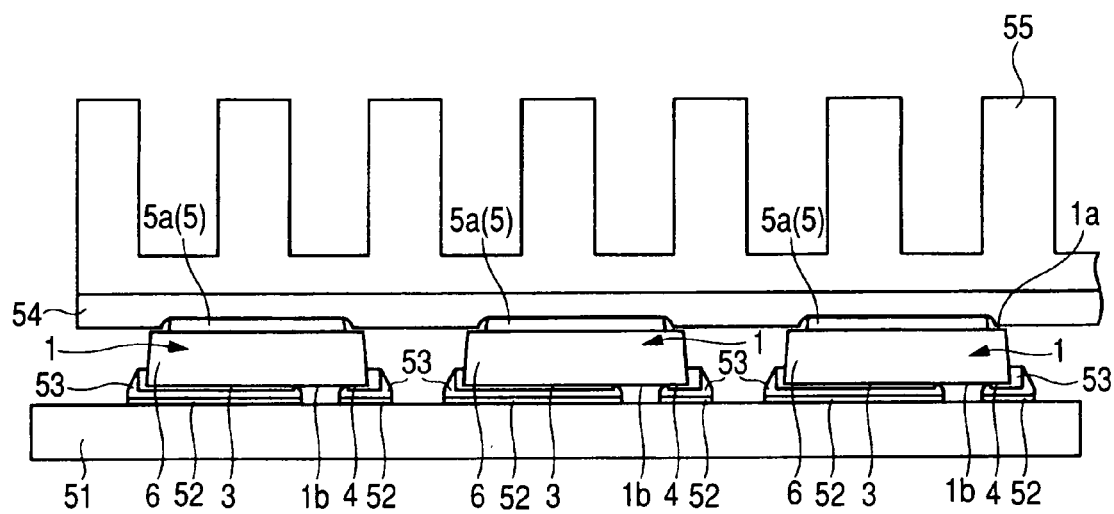
FIG. 31 is a sectional view showing a state in which plural semiconductor devices are mounted on a mounting substrate.
Figure 32:
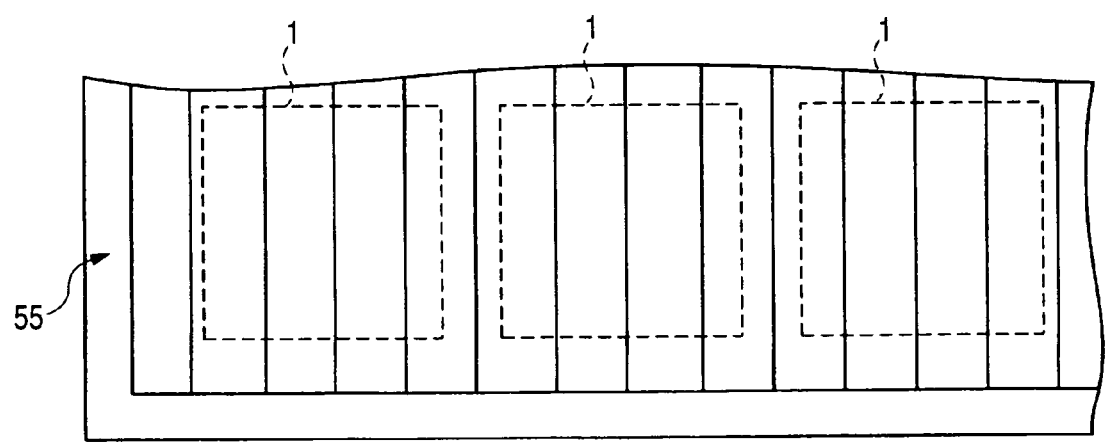
FIG. 32 is a top view of FIG. 31.

FIG. 31 is a sectional view (sectional view of a principal portion) showing a mounted state of plural semiconductor devices 1 onto a mounting substrate 51 and FIG. 32 is a top view (plan view) thereof.

As shown in FIGS. 31 and 32, plural semiconductor devices 1 are mounted onto the mounting substrate (wiring substrate) 51. At this time, the back surfaces (bottoms) 1b of the semiconductor devices serve as mounting surfaces for the mounting substrate 51 and external connecting terminals, i.e., source, gate and drain terminals 3, 4, 5 (respective lower surfaces 3a, 4a, 5f), exposed to the back surfaces 1b of the semiconductor devices 1 are joined and electrically connected to terminals 52 of the mounting substrate 51 through an electrically conductive bonding material 53 such as solder. In the section of FIG. 31, the source terminals 3 (the lower surfaces 3a thereof) and the gate terminals 4 (the lower surfaces 4a thereof) exposed to the back surfaces 1b of the semiconductor devices 1 are joined to the terminals 52 of the semiconductor devices through the bonding material 53. But in another section, the second portions 5b (the lower surfaces 5f thereof) of the drain terminals 5 exposed to the back surfaces 1b of the semiconductor devices 1 are joined to the terminals 52 of the mounting substrate 51 through the bonding material 53.

A heat dissipating fin (heat dissipating component or heat sink) 55 is disposed (mounted) on upper surfaces (surfaces) 1a of the plural semiconductor devices 1 through a heat conducting sheet (heat dissipating sheet) 54. The heat dissipating fin 55 is formed of a metallic material such as, for example, aluminum (Al) or aluminum alloy. The heat conducting sheet 54 is an insulating sheet having elasticity and is relatively high in thermal conductivity. For example, the heat conducting sheet 54 is formed of a silicon-, acryl- or ethylene propylene-based material and is constituted by a rubbery or gel-like sheet or the like. The heat conducting sheet 54 may be formed using glass cloth as a base material and any of the above materials mixed therein. The heat conducting sheet 54 may be sandwiched in between the semiconductor device 1 as a heat generating body and the heat dissipating fin 55 as a heat dissipating component so that it functions to enhance the heat dissipating effect. The heat dissipating fin 55 is fixed to the mounting substrate 51 with screws or metallic fixing pieces (not shown). The heat dissipating fin 55 may be joined and fixed to the upper surfaces 1a of the plural semiconductor devices 1 with use of a heat dissipating resin adhesive instead of the heat conducting sheet 54.

When each semiconductor device 1 is operated and the semiconductor chip 2 mounted within the semiconductor device is allowed to operate, the semiconductor chip 2 generates heat. To the semiconductor chip 2 are connected the source terminal 3, gate terminal 4 and drain terminal 5, which terminals are each formed using a conductor (metal such as copper alloy) higher in thermal conductivity than the sealing resin portion 6. Therefore, the heat generated from the semiconductor chip 2 within the semiconductor device 1 is dissipated to the exterior of the semiconductor device 1 through the source, gate and drain terminals 3, 4, 5. At this time, the heat generated from the semiconductor chip 2 is dissipated toward the mounting substrate 51 through the source, gate and drain terminals 3, 4, 5 and is dissipated also to the heat dissipating fin 55 through the drain terminal 5 and the heat conducting sheet 54. The heat dissipating fin 55 is formed with plural fins and the heat conducted from the semiconductor device 1 to the heat dissipating fin 55 is further dissipated into the outside air.

In the semiconductor device 1 of this embodiment, the source terminal 3, the gate terminal 4 and the drain terminal 5 (the second portion 5b thereof) are exposed as external connecting terminals to the back surface 1b of the semiconductor device 1 and the upper surface 5e of the first portion 5a of the drain terminal 5 is exposed to the upper surface 1a of the semiconductor device 1 (the upper surface 6a of the sealing resin portion 6). Consequently, the heat generated from the semiconductor chip 2 within the semiconductor device 1 can be dissipated from both surfaces (both sides) which are the back surface 1b side (the source terminal 3, gate terminal 4 and the second portion 5b of the drain terminal 5) and the upper surface 1a side (the first portion 5a of the drain terminal 5). As a result, it is possible to improve the heat dissipating characteristic (heat dissipating performance) and hence performance of the semiconductor device which is in the form of a resin sealed semiconductor package.

In case of manufacturing a resin sealed semiconductor package with terminals exposed to both upper and lower surfaces like the semiconductor device 1, pressures are applied from both above and below to the semiconductor chip to be sealed within the sealing resin portion, with a consequent likelihood of cracking of the semiconductor chip 2, as explained above with reference to FIG. 20. The occurrence of such cracking leads to a lowering in production yield of the semiconductor device.

In this embodiment, as shown in FIG. 18, improvement is made lest the mold halves 31 and 32 should press the upper surface 35a of the first portion 25a of the drain terminal portion 25 in the lead frame 21 in the molding process of step S5. More specifically, in the molding process of step S5, only the outer periphery portion of the lead frames 21 and 22 are fixed (clamped) by the mold halves 31 and 32, and in this case the lower surfaces 35b and 35c of the source and gate terminal portions 23, 24 and the second portion 25b of the drain terminal portion 25 are put in contact with the upper surface 32a of the mold half 32 as the lower mold half, but the first portion 25a of the drain terminal portion 25 in the lead frame 21 and the mold half 31 as the upper mold half do not contact each other, allowing the gap 34 to be formed between the upper surface 35a of the second portion 25a of the drain terminal portion 25 in the lead frame 21 and the lower surface 31a of the mold half 31 (the upper surface of the cavity 33). Thus, on the upper surface of the cavity 33, the mold half 31 comes into contact with none of the source, gate and drain terminal portions 23, 24, 25. Therefore, when the lead frames 21 and 22 are clamped by the mold halves 31 and 32, the semiconductor chip 2 can be prevented from being pressed from above and below through terminal portions. Consequently, it is possible to prevent cracking of the semiconductor chip 2 and hence possible to improve the production yield of the semiconductor device (semiconductor package). Further, it is possible to reduce the cost of the semiconductor device.

In the molding process of step S5 in this embodiment it is thus possible to prevent pressures from being applied to the semiconductor chip 2 from above and below. However, terminal portions are not exposed to the upper surface 26a of the sealing resin portion 26 to be formed in the molding process and the sealing resin portion 26 is formed also on the first portion 25a of the drain terminal portion 25 which is to be exposed to the upper surface of the sealing resin portion. In this state it is impossible to obtain a resin sealed semiconductor package with terminals exposed to both upper and lower surfaces of the semiconductor chip 1. In this embodiment, therefore, a polishing process of step S6 for the sealing resin portion 26 is performed after the molding process of step S5. In the polishing process of step S6 for the sealing resin portion 26, at least the upper surface 26*a* side of the sealing resin portion 26 is polished. More preferably, both upper surface 26*a* and back surface 26*b* of the sealing resin portion 26 are polished. By polishing the upper surface 26*a* of the sealing resin portion 26 to remove the sealing resin portion located on the first portion 25*a* of the drain terminal portion 25, it is possible to let the first portion 25*a* of the drain terminal portion 25 be exposed on the upper surface of the sealing resin portion 26. In this way it is possible to obtain a resin sealed semiconductor package with terminals exposed to both upper and lower surfaces like the semiconductor device 1.

According to this embodiment, liquid honing is used in the polishing process of step S6 for the sealing resin portion 26. Since the polishing of the sealing resin portion 26 is performed using liquid honing, it is possible to prevent pressures being applied to the semiconductor chip during polishing of the sealing resin portion 26. With use of liquid honing, the sealing resin portion 26 can be polished while suppressing or preventing the application of stress or damage to the semiconductor chip 2 during polishing of the sealing resin portion 26 and therefore it becomes possible to further improve the production yield of the semiconductor device (semiconductor package).

In this embodiment, moreover, by polishing the upper surface 26*a* of the sealing resin portion 26 with use of liquid honing, the upper surface 35*a* of the first portion 25*a* of the drain terminal portion 25 can be brought into a slightly projected state from the upper surface 26*c* of the sealing resin portion 26 after polishing. That is, the upper surface 5*e* of the first portion 5*a* of the drain terminal portion 5 in the semiconductor device 1 produced can be brought into a slightly projected state from the upper surface 6*a* of the sealing resin portion 6. Since the first portion 5*a* (the upper surface 5*e* thereof) of the drain terminal 5 is put in a slightly projected state from the upper surface 6*a* of the sealing resin portion 6, it is possible to improve the adhesion between the first portion 5*a* of the drain terminal 5 in the semiconductor device 1 and the head conducting sheet 54 when such a heat dissipating component as the heat dissipating fin 55 is disposed (mounted) on the semiconductor device 1 through for example the heat conducting sheet 54 as shown in FIG. 31. Consequently, it is possible to improve the thermal conductivity between the first portion. 5*a* of the drain terminal 5 in the semiconductor device 1 and the heat conducting sheet 54 and the heat produced in the semiconductor chip 2 can be dissipated more completely by such a heat dissipating component as the heat dissipating fin 55 through the drain terminal 5 and the heat conducting sheet 54.

Further, in this embodiment, by polishing the back surface 26*b* of the sealing resin portion 26 with use of liquid honing, not only the back surface 26*b* of the sealing resin portion 26 can be deburred, but also the lower surfaces of the source terminal portion 23, gate terminal portion 24 and the second portion 25*b* of the drain terminal portion 25 can be brought into a slightly projecting state from the back surface 26*d* of the sealing resin portion 26 after polishing. That is, the lower surfaces 3*a*, 4*a* and 5*f* of the source terminal 3, gate terminal 4 and the second portion 5*b* of the drain terminal 5 in the semiconductor device 1 can be brought into a slightly projecting state from the back surface 6*b* of the sealing resin portion 6. As a result, not only the lower surface but also a portion of side faces of the external connecting terminals (source terminal 3, gate terminal 4 and the second portion 5*b* of the drain terminal 5) are also exposed to the back surface 1*b* of the semiconductor device 1 (back surface 6*b* of the sealing resin portion 6). On the back surface 1*b* of the semiconductor device 1, by bringing the external connecting terminals (source terminal 3, gate terminal 4 and the second portion 5*b* of the drain terminal 5) into a slightly projecting state from the back surface 6*b* of the sealing resin portion 6, that is, by forming a stand-off portion in each external connecting terminal, it is possible to improve the mounting reliability (reliability of soldering between the external connecting terminals in the semiconductor device 1 and the terminals of the semiconductor device 1 when the semiconductor device is mounted on the mounting substrate 51 as shown in FIG. 31. For example, when the semiconductor substrate 1 is mounted on the mounting substrate 51, the solder which constitutes the bonding material 53 wicks (rises) along the exposed side faces of the external connecting terminals (source terminal 3, gate terminal 4 and the second portion 5*b* of the drain terminal 5) in the semiconductor device 1, whereby it is possible to improve the connection strength between the external connecting terminals in the semiconductor device 1 and the terminals 52 of the mounting substrate 51 and hence possible to improve the mounting reliability of the semiconductor device 1.

In this embodiment, the semiconductor chip 2 is sandwiched above and below in between plural terminals (source, gate and drain terminals 3, 4, 5) and there is produced the semiconductor device 1 of a resin sealed semiconductor package form with terminals exposed on both upper and lower surfaces. Therefore, although a semiconductor chip having electrodes on only one of the surface 2*a* and the back surface 2*b*, (i.e., a semiconductor chip having electrodes on the surface 2*a* and not having electrodes on the back surface 2*b*) is also employable as the semiconductor chip 2, but it is more effective to apply this embodiment to the case where a semiconductor chip having electrodes on both surface 2*a* and back surface 2*b* as described above (i.e., a semiconductor chip having both surface and back electrodes) is used as the semiconductor chip 2.

As the semiconductor chip 2 used in this embodiment there may be used any of semiconductor chips formed with various semiconductor elements. No limitation is made to the semiconductor chip formed with a vertical power MISFET (Metal Insulator Semiconductor Field Effect Transistor) having the trench gate structure described above. Various other semiconductor chips are employable. However, since in this embodiment the heat dissipating performance is improved by exposing terminals on both upper and lower surfaces, it is very effective to apply this embodiment to the case where a semiconductor chip large in the amount of heat generated, e.g., a semiconductor chip formed with a power transistor such as a power MISFET, (a semiconductor chip formed with a semiconductor amplifying element), is used as the semiconductor chip 2. Since the semiconductor chip formed with a vertical power MISFET having the above trench gate structure is relatively large in the amount of heat generated during operation, it is more effective to apply this embodiment to the case where a semiconductor chip formed with a vertical power MISFET having the trench gate structure is used as the semiconductor chip 2.

Second Embodiment

In the previous first embodiment the polishing process of step S6 for the sealing resin portion 26 is carried out by liquid honing, but in this second embodiment the polishing process of step S6 for the sealing resin portion 26 is carried out by mechanical polishing. This second embodiment is almost the same as the first embodiment except that the polishing process of step S6 for the sealing resin portion 26 is performed by mechanical polishing instead of liquid polishing. Therefore, a description will be omitted as to the portion common to the first embodiment.

Figure 26:
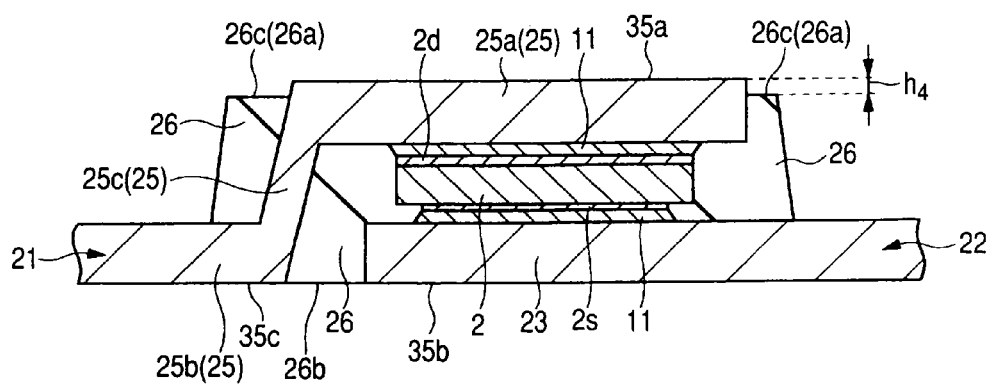
FIG. 26 is a sectional view of the semiconductor device in a semiconductor device manufacturing step which follows FIG. 25.
Figure 27:
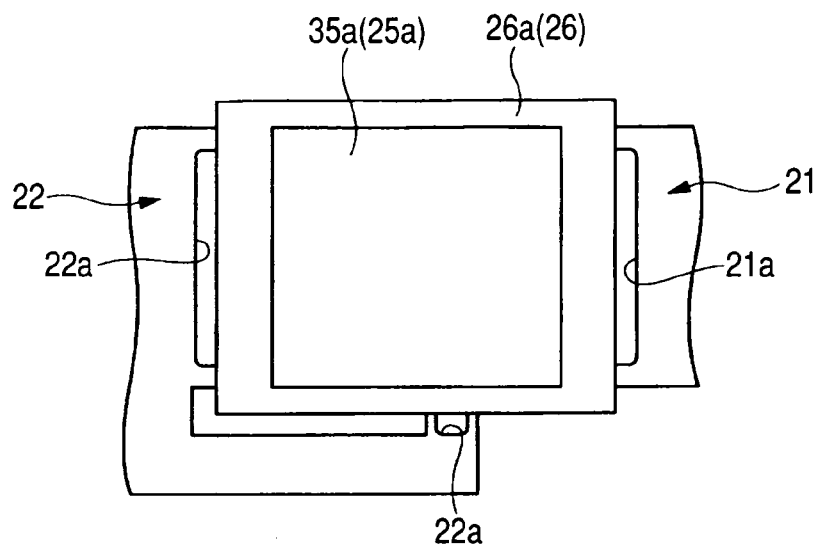
FIG. 27 is a plan view of the semiconductor device in the same semiconductor device manufacturing step as FIG. 26.
Figure 28:
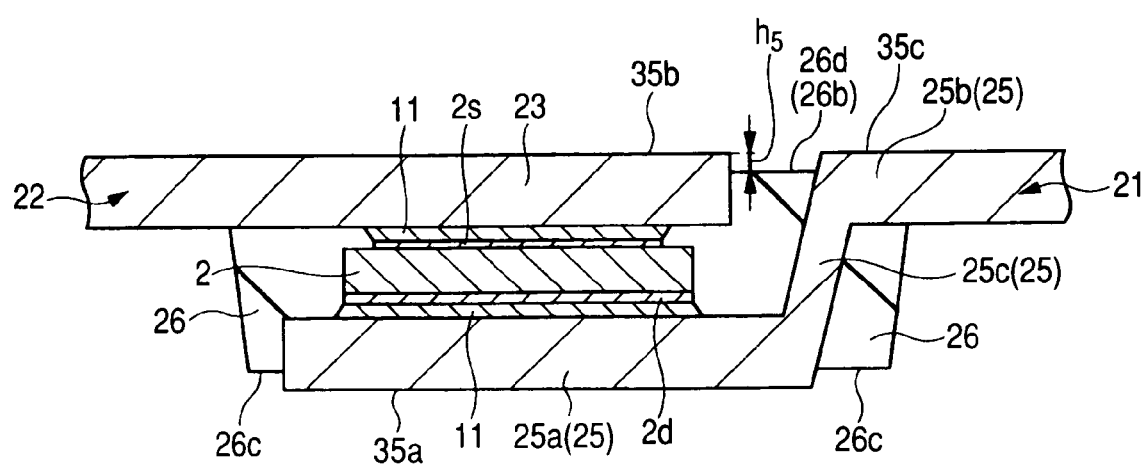
FIG. 28 is a sectional view of the semiconductor device in a semiconductor device manufacturing step which follows FIG. 26.
Figure 29:
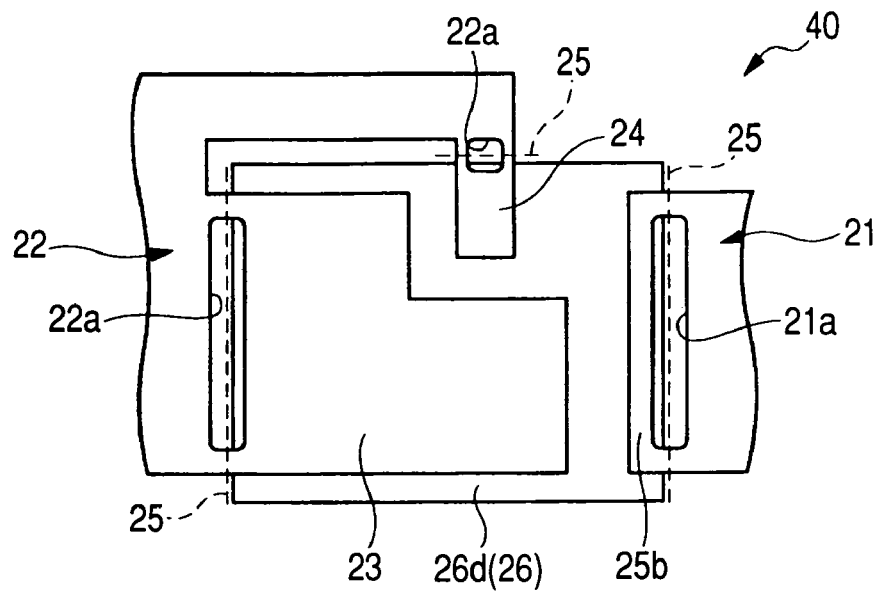
FIG. 29 is a plan view of the semiconductor device in a semiconductor device manufacturing step which follows FIG. 28.
Figure 33:
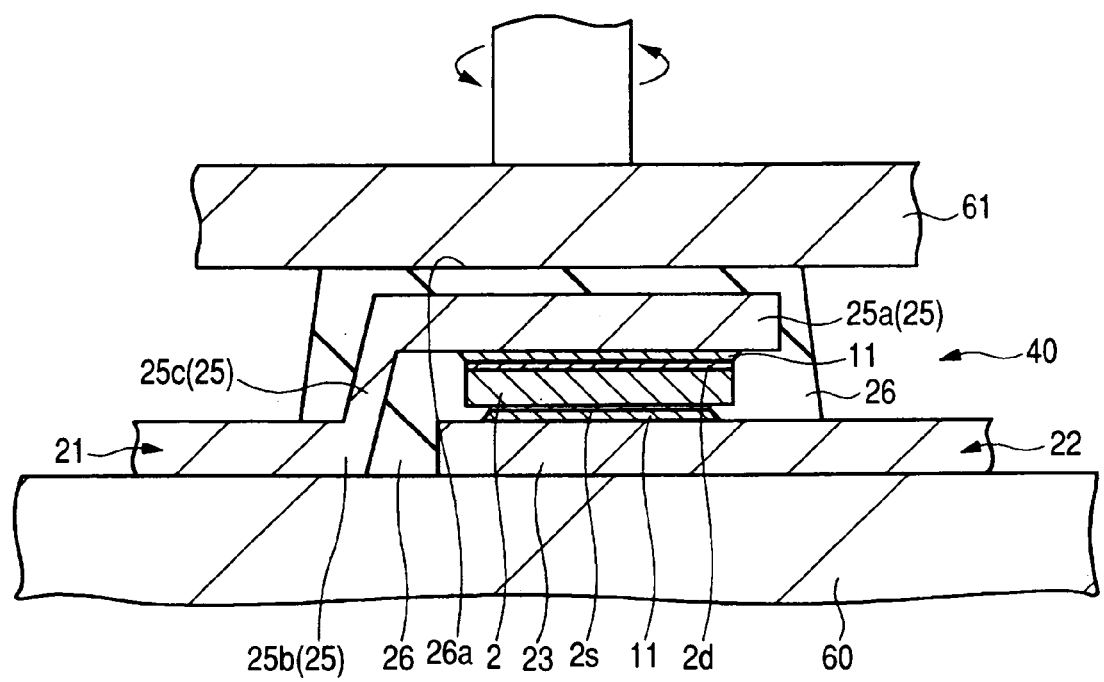
FIG. 33 is an explanatory diagram of a polishing process for a sealing resin portion in a manufacturing process for a semiconductor device according to another embodiment of the present invention.
Figure 34:
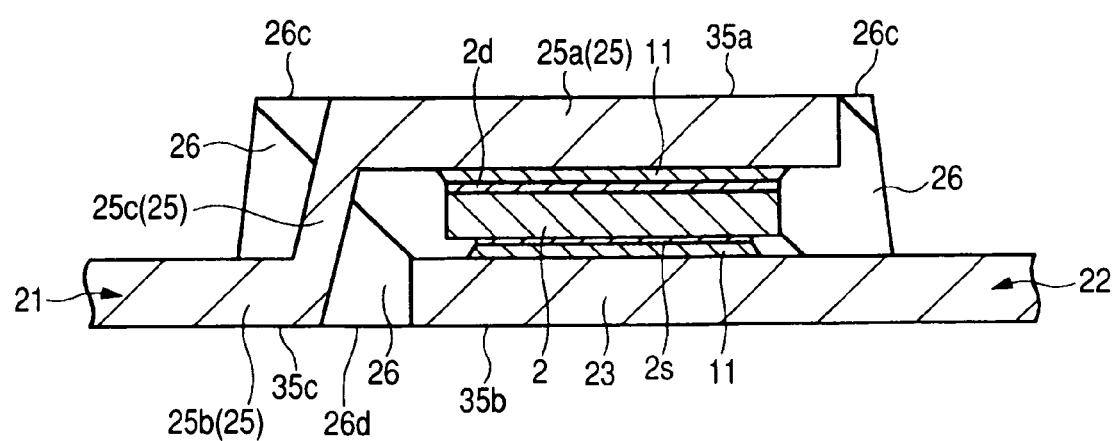
FIG. 34 is a sectional view showing a state after the polishing process of FIG. 33.
Figure 35:
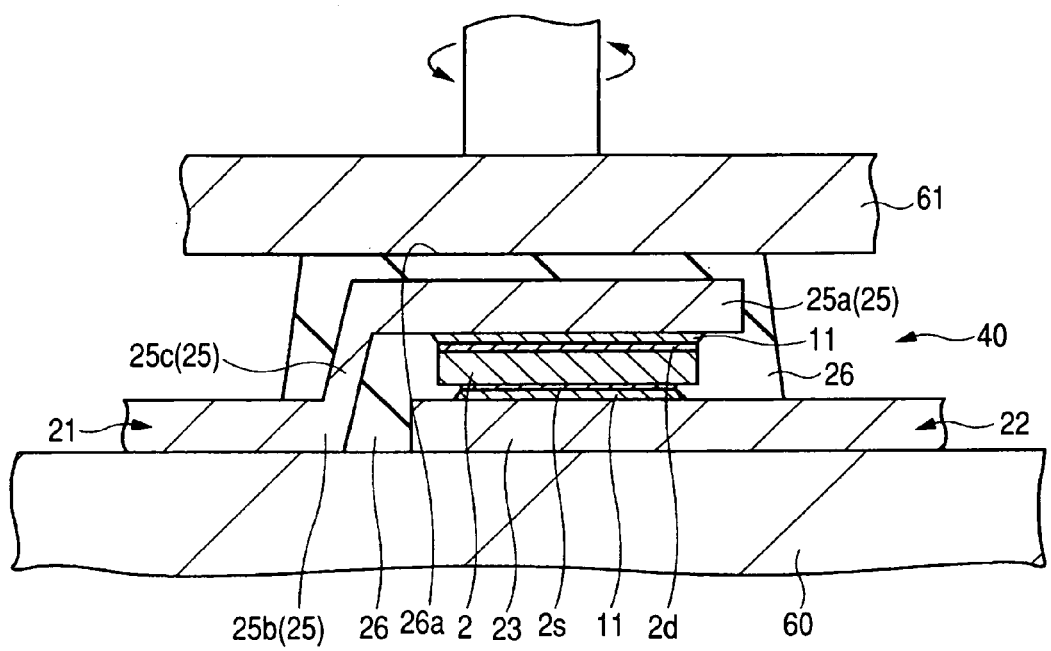
FIG. 35 is an explanatory diagram of a polishing process for a sealing resin portion in a manufacturing process for a semiconductor device according to a further embodiment of the present invention.

FIG. 33 is an explanatory diagram of the polishing process of step S6 for the sealing resin portion 26 according to this embodiment and FIG. 34 is a sectional view (a sectional view of a principal portion) showing a state after polishing of the sealing resin portion 26, corresponding to FIG. 26 or FIG. 28 in the first embodiment.

In this embodiment, after forming the sealing resin portion 26 by carrying out the constituent steps up to step S5 in the same manner as in the first embodiment, the sealing resin portion 26 is subjected to the polishing process of step S6 by mechanical polishing. In the polishing process of step S6, the upper surface 26a side of the sealing resin portion 26 is polished mechanically using a surface grinder or the like. For example, as shown schematically in FIG. 33, the assembly (work) 40 which has been formed with the sealing resin portion 26 in step S5 is placed on a conveyance lane or table 60 and a rotating abrasive (grinding) disc 61 is pushed against the upper surface 26a of the sealing resin portion 26 to polish the upper surface 26a, whereby the upper surface 26a side of the sealing resin portion 26 is polished and removed. As a result, the sealing resin portion 26 on the first portion 25a of the drain terminal portion 25 is removed and the upper surface 35a of the first portion 25a of the drain terminal portion 25 is exposed from the upper surface 26c of the sealing resin portion 26 after polishing.

In this embodiment, since the polishing process for the sealing resin portion is carried out by mechanical polishing, it is possible to increase the polishing speed and also possible to polish plural sealing resin portions 26 at a time. Consequently, it is possible to shorten the time required for polishing the sealing resin portion 26 and hence possible to increase the throughput of the semiconductor device.

According to the liquid honing used in the first embodiment the sealing resin portion 26 is removed selectively lest the metallic terminal portions (source, gate and drain terminal portions 23, 24, 25) should be polished (removed). But in this second embodiment the upper surface 26a side of the sealing resin portion 26 is polished by mechanical polishing, so that not only the sealing resin portion 26 but also a metallic terminal portions (source, gate or drain terminal portion 23, 24 or 25) can also be polished (removed). Therefore, as shown in FIG. 34, the upper surface 35a of the first portion 25a of the drain terminal portion 25 and the upper surface 26c of the sealing resin portion 26 after polishing become flush with each other. Further, if mechanical polishing is adopted when the back surface 26b side of the sealing resin portion 26 is polished for deburring, the lower surfaces 35b and 35c of the source terminal portion 23, gate terminal portion 24 and the second portion 25b of the drain terminal portion 25 become flush with the back surface 26d of the sealing resin portion 26 after polishing.

After the polishing process of step S6 for the sealing resin portion 26 is performed in the above manner, there are performed a plating process of step S7 and a cutting process of step S8 in the same way as in the first embodiment to afford the same semiconductor device as the semiconductor device 1 of the first embodiment. However, in this second embodiment, the upper surface 5e of the first portion 5a of the drain terminal 5 and the upper surface 6a of the sealing resin portion 6 become flush with each other and likewise the lower surfaces 3a, 4a and 5f of the source terminal 3, gate terminal 4 and the second portion 5b of the drain terminal 5 become flush with the back surface 6 of the sealing resin portion 6.

Also in this second embodiment it is possible to obtain about the same effects as in the first embodiment. For example, it is possible to produce in high production yield a semiconductor device which is in the form of a resin sealed semiconductor package with terminals exposed to both upper and lower surfaces and which is superior in heat dissipating characteristic. In this second embodiment, moreover, by using mechanical polishing in the polishing process of step S6 for the sealing resin portion 26 it is possible to shorten the time required for polishing the sealing resin portion 26 and hence possible to improve the throughput of the semiconductor device.

Third Embodiment

The polishing process of step S6 for the sealing resin portion 26 in the first embodiment is carried out by liquid honing, while in this third embodiment the polishing process of step S6 for the sealing resin portion 26 is performed by a combination of both mechanical polishing and liquid polishing. Other constructional points are about the same as in the first embodiment and therefore a description thereof will here be omitted.

FIGS. 35 to 38 are explanatory of the polishing process of step S6 for the sealing resin portion 26 in this third embodiment.

Figure 36:
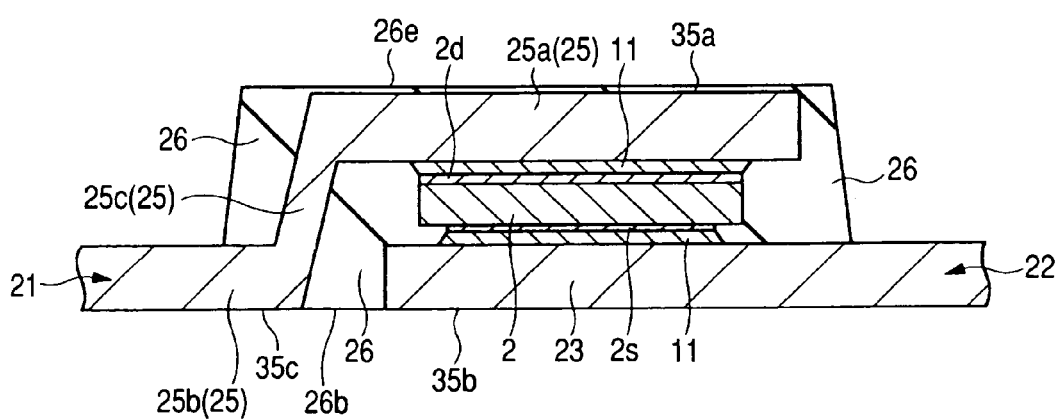
FIG. 36 is an explanatory diagram of a polishing step for the sealing resin portion which follows FIG. 35.

In this third embodiment, after forming the sealing resin portion 26 in step S5 in the same way as in the first embodiment, first the upper surface 26a side of the sealing resin portion 26 is polished by mechanical polishing. For example, as shown schematically in FIG. 35, the assembly (work) 40 which has been formed with the sealing resin portion 26 in step S5 is placed on the conveyance lane or table 60 and the rotating abrasive disc 61 is pushed against the upper surface 26a of the sealing resin portion 26 to polish the upper surface 26a of the sealing resin portion 26. In this case, as shown in FIG. 36, it is preferable that the mechanical polishing be completed before the upper surface 35a of the first portion 25a of the drain terminal portion 25 becomes exposed from the upper surface 26e after mechanical polishing of the sealing resin portion 26.

Figure 37:
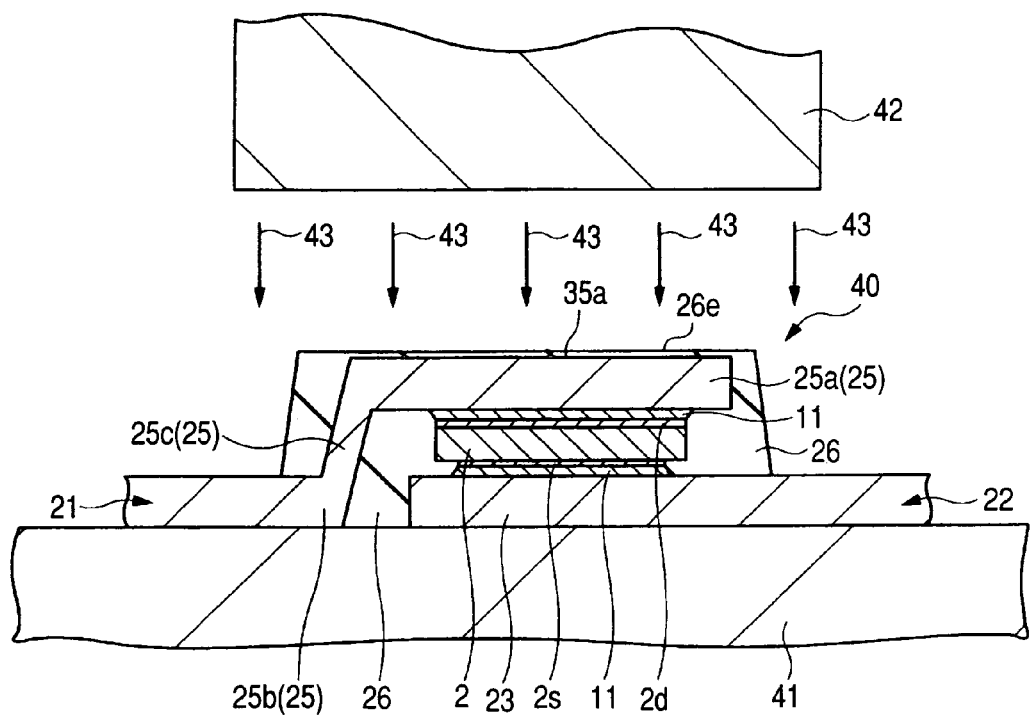
FIG. 37 is an explanatory diagram of a polishing step for the sealing resin portion which follows FIG. 36.
Figure 38:
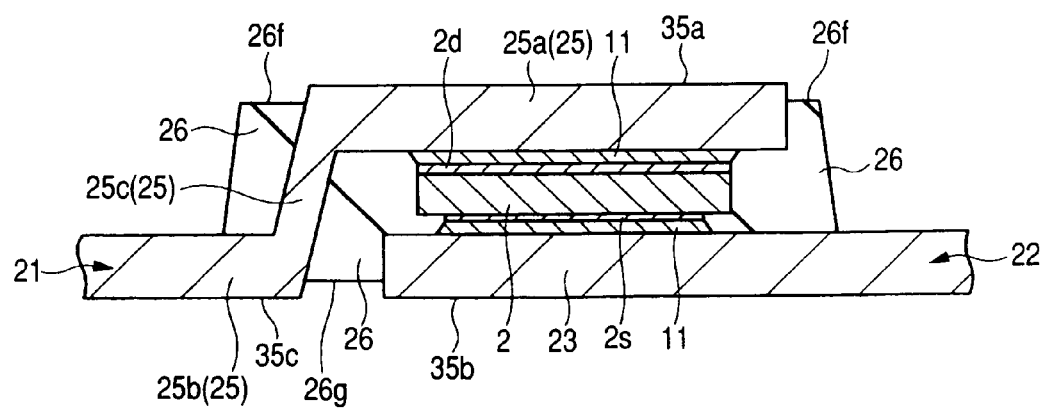
FIG. 38 is an explanatory diagram of a polishing step for the sealing resin portion which follows FIG. 37.

Then, as shown in FIG. 37, polishing of the upper surface 26e (upper surface 26a) of the sealing resin portion 26 is performed by liquid honing. The liquid honing can be performed in the same way as in the first embodiment and therefore a description thereof will here be omitted. By this liquid honing, as shown in FIG. 38, the sealing resin portion 26 present on the upper surface 35a of the first portion 25a of the drain terminal portion 25 is removed completely and the upper surface 35a of the first portion 25a of the drain terminal portion 25 is exposed from the upper surface 26f of the sealing resin portion after polishing. Further, the back surface 26b of the sealing resin portion 26 is polished to remove burrs, etc.

In this third embodiment, first the upper surface 26a side of the sealing resin portion 26 is polished (roughly ground) a predetermined thickness by mechanical polishing, whereby it is possible to increase the polishing speed for the sealing resin portion 26 and it is also possible to polish plural sealing resin portions 26 at a time. Consequently, it is possible to shorten the time required for the polishing process. After the mechanical polishing, liquid honing is performed for at least the upper surface 26e side of the sealing resin portion 26, preferably both upper surface 26e and back surface 26b, whereby it is possible to diminish stress and damage which are applied to the semiconductor chip 2 during polishing. Besides, since polishing by liquid honing is performed finally, the upper surface 35a of the first portion 25a of the drain terminal portion (the upper surface 5e of the first portion 5a of the drain terminal 5) can be put in a slightly projecting state from the upper surface 26f of the sealing resin portion 26 (upper surface 6a of the sealing resin portion 6) after polishing. As a result, as in the first embodiment, it is possible to further improve the adhesion between the first portion 5a of the drain terminal 5 in the semiconductor device 1 and the heat conducting sheet 54 and hence possible to further improve the heat dissipation efficiency of the semiconductor device 1. Further, the back surface 26b of the sealing resin portion 26 can be deburred and the lower surfaces 35b and 35c of the source terminal portion 23, gate terminal portion 24 and the second portion 25b of the drain terminal portion 25 (the lower surfaces 3a, 4a and 5f of the source terminal 3, gate terminal 4 and the second portion 5b of the drain terminal S) can be put in a slightly projecting state from the back surface 26g of the sealing resin portion 26 (back surface 6b of the sealing resin portion 6) after polishing. Consequently, as in the first embodiment, it is possible to further improve the mounting reliability of the semiconductor device 1 to the mounting substrate 51.

After the polishing process of step S6 for the sealing resin portion 26 is performed in the above manner, the plating process of step S7 and the cutting process of step S8 are performed as in the first embodiment to afford the same semiconductor device as the semiconductor device 1 of the first embodiment.

Also in this third embodiment there can be obtained almost the same effects as in the first embodiment. For example, a semiconductor device which is in the form of a resin sealed semiconductor package with terminals exposed to both upper and lower surfaces and which is superior in heat dissipating characteristic can be produced in high production yield. Further, in this third embodiment, by performing the polishing process of step S6 for the sealing resin portion 26 as a combined process of both mechanical polishing and subsequent liquid honing, it is possible to shorten the working time required for the polishing process.

Fourth Embodiment

Figure 39:
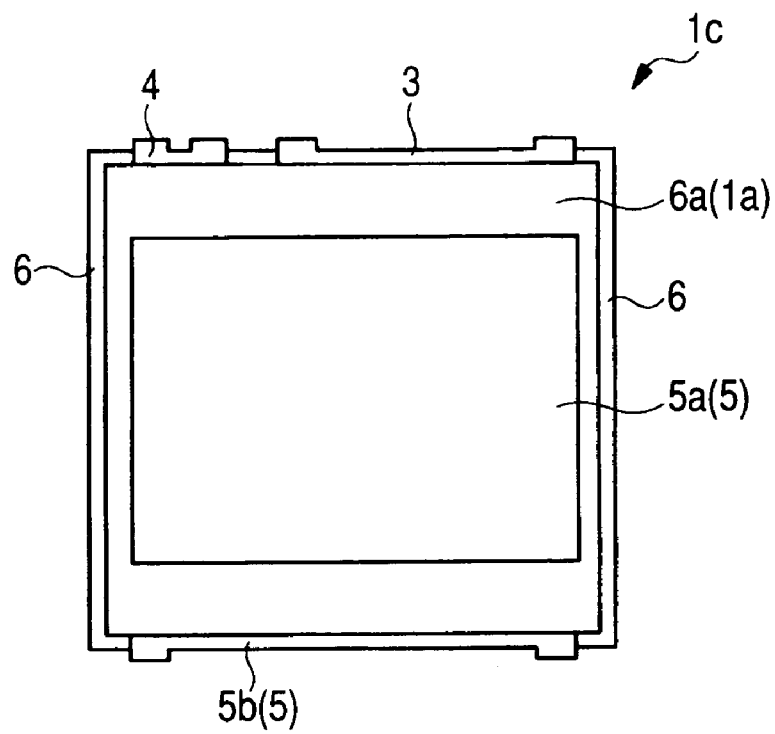
FIG. 39 is a top view of a semiconductor device according to a still further embodiment of the present invention.
Figure 40:
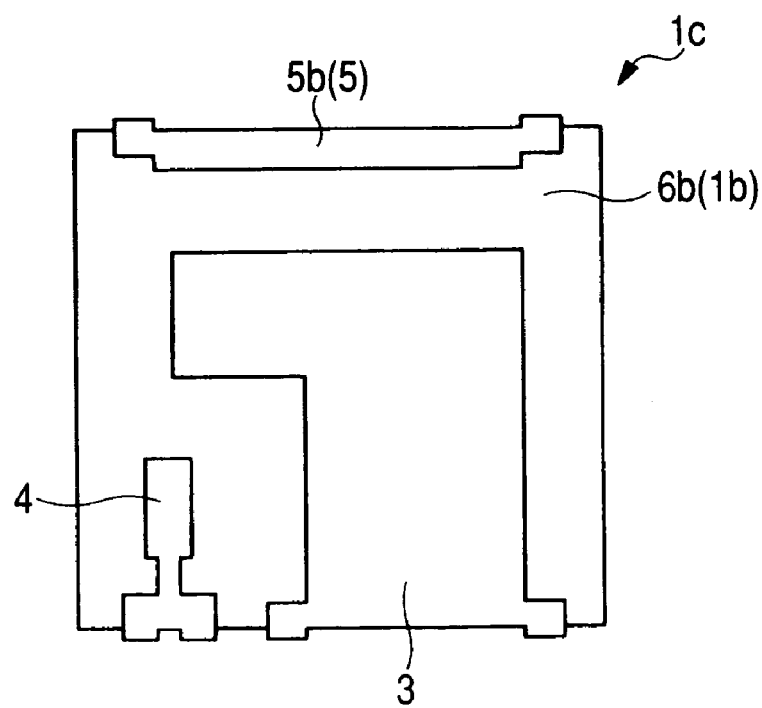
FIG. 40 is a bottom view of the semiconductor device of FIG. 39.
Figure 41:
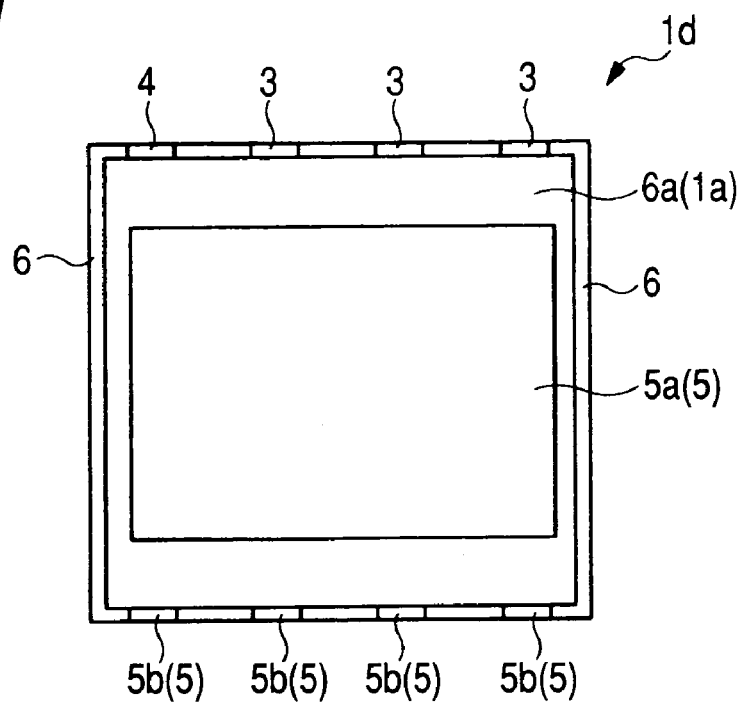
FIG. 41 is a top view of a semiconductor device according to a still further embodiment of the present invention.
Figure 42:
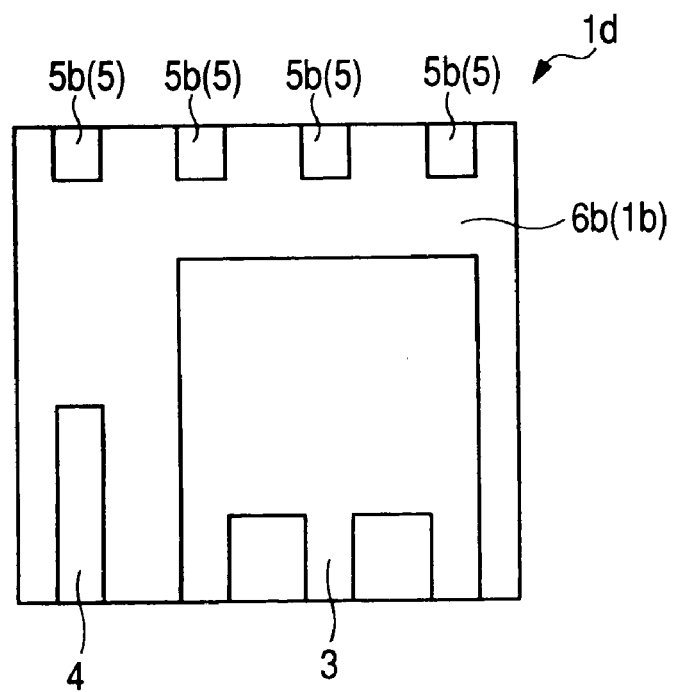
FIG. 42 is a bottom view of the semiconductor device of FIG. 41.
Figure 43:
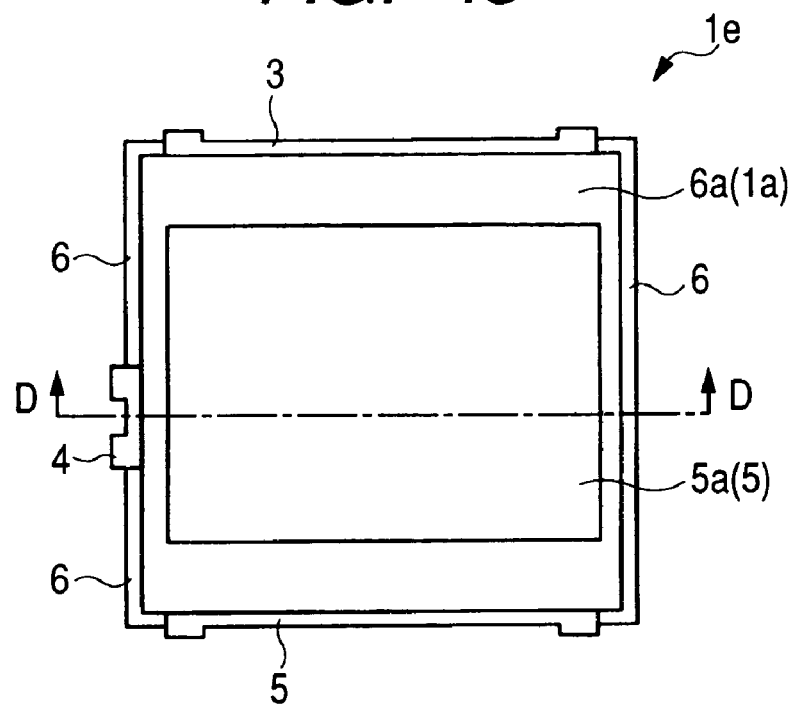
FIG. 43 is a top view of a semiconductor device according to a still further embodiment of the present invention.
Figure 44:
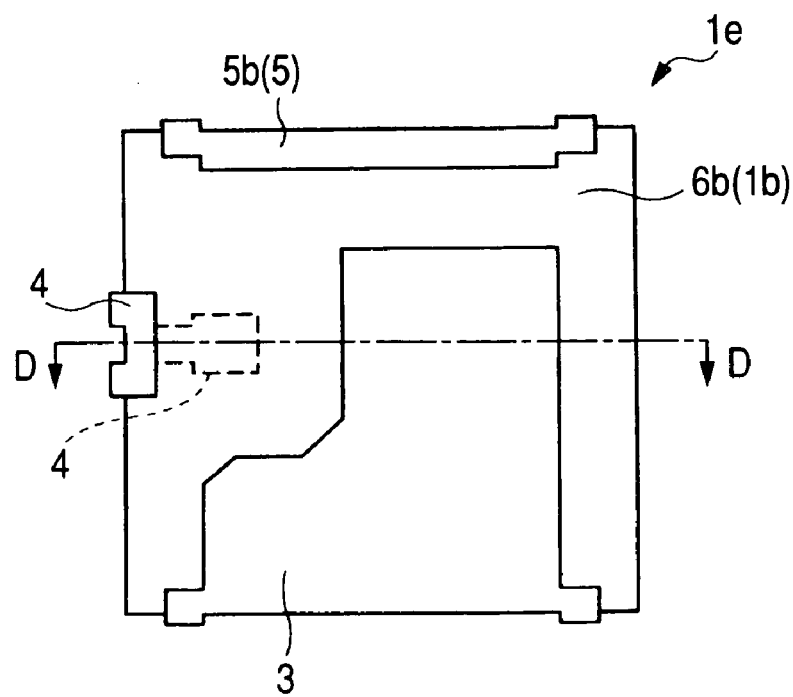
FIG. 44 is a bottom view of the semiconductor device of FIG. 43.
Figure 45:
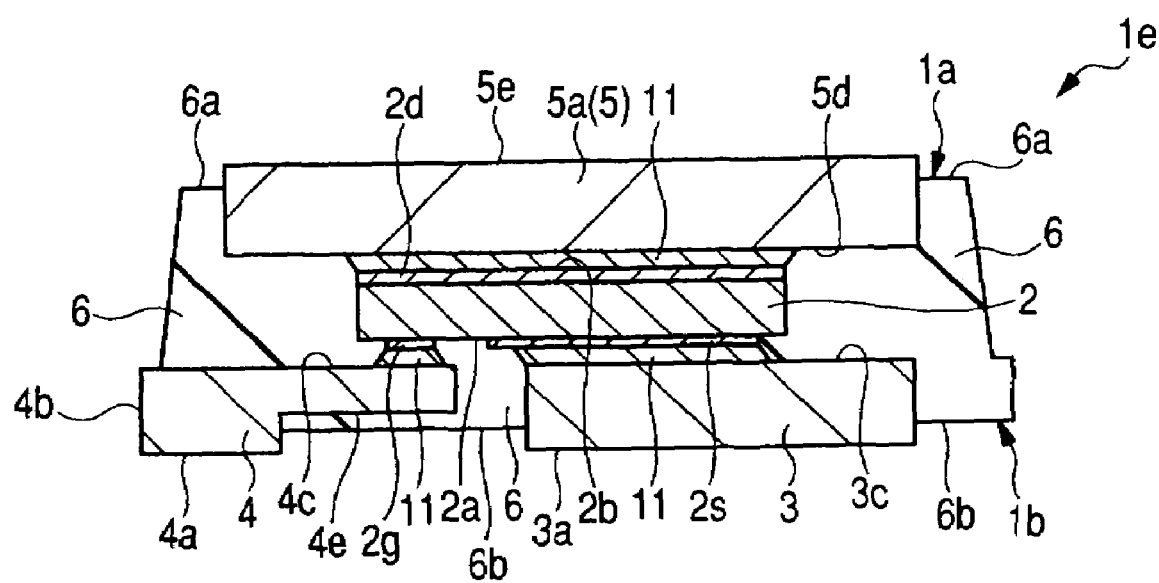
FIG. 45 is a sectional view of the semiconductor device of FIG. 43.

The layout of terminals in the semiconductor device 1 shown in the first embodiment may be changed in accordance with, for example, the mounting substrate 51 for mounting the semiconductor device 1 thereon. FIG. 39 is a top view (plan view) of a semiconductor device 1c according to a still further embodiment of the present invention and FIG. 40 is a bottom view (back view or plan view) thereof. FIG. 41 is a top view (plan view) of a semiconductor device id according to a still further embodiment of the present invention and FIG. 42 is a bottom view (back view or plan view) thereof. FIG. 43 is a top view (plan view) of a semiconductor device 1e according to a still further embodiment of the present invention, FIG. 44 is a bottom view (back view or plan view) thereof, and FIG. 45 is a sectional view (sectional side view) thereof. FIGS. 39, 41 and 43 correspond to FIG. 1 in the first embodiment and FIGS. 40, 42 and 44 correspond to FIG. 2 in the first embodiment. FIG. 45, which is a sectional view taken on line D-D in FIGS. 43 and 44, corresponds to FIG. 5 in the first embodiment.

In the semiconductor device 1 of the first embodiment the source terminal 3, gate terminal 4 and the second portion 5b of the drain terminal 5 as external terminals are provided on three different end sides of the back surface 1b of the semiconductor device 1 (back surface 6b of the sealing resin portion 6), but in the semiconductor device 1c shown in FIGS. 39 and 40, the source terminal 3, gate terminal 4 and the second portion 5b of the drain terminal 5 as external terminals are provided on two end sides of the back surface 1b of the semiconductor device 1c (back surface 6b of the sealing resin portion 6), the source and gate terminals 3, 4 being provided on the same end side of the back surface 1b of the semiconductor device 1c (back surface 6b of the sealing resin portion 6).

Also in the semiconductor device 1d shown in FIGS. 41 and 42, as in the semiconductor device 1c shown in FIGS. 39 and 40, the source terminal 3, gate terminal 4 and the second portion 5b of the drain terminal 5 as external terminals are provided on two end sides of the back surface 1b of the semiconductor device 1 (back surface 6b of the sealing resin portion 6), the source and gate terminals 3, 4 being provided on the same end side of the back surface 1b of the semiconductor device 1b (back surface 6b of the sealing resin portion 6). In the semiconductor device 1d, however, there are provided plural second portions 5b of the drain terminal 5. That is, the second portion 5b of the drain terminal 5 in the semiconductor device 1d is divided into plural portions. In the drain terminal 5 of the semiconductor device 1d, plural second portions 5b are connected to one first portion 5a through a stepped portion 5c (not shown here). An end portion of the source terminal 3 (an end portion located sideways of the sealing resin portion 6) in the semiconductor device 1d is also divided into plural portions. According to this structure, plural second portions 5b of the drain terminal 5 in the semiconductor device 1d can be connected to plural terminals 52 of the mounting substrate 51 and the source terminal 3 in the semiconductor device 1d can also be connected to plural terminals 52.

Thus, the layout of terminals in each semiconductor device can be set on the customer side so as to match the mounting substrate for mounting of the semiconductor device thereon.

According to the configuration of the semiconductor device 1e shown in FIGS. 43 to 45, the lower surface 4e of a part (near the portion connected to the gate pad electrode 2g of the semiconductor chip 2) of the gate terminal 4 is sealed within the sealing resin portion 6 and is not exposed from the sealing resin portion. The area of the gate pad electrode 2g of the semiconductor chip 2 is smaller than the area of the source pad electrode 2s and that of the back-surface drain electrode 2d and the area of connection between the gate terminal 4 and the gate pad electrode 2g of the semiconductor chip 2 is smaller than the area of connection between the source terminal 3 and the source pad electrode 2s of the semiconductor chip 2 and the area of connection between the first portion 5a of the drain terminal 5 and the back-surface drain electrode 2d of the semiconductor chip 2. Consequently, there is a possibility that the strength of connection between the gate terminal 4 and the gate pad electrode 2g of the semiconductor chip 2 may become lower (weaker) than the strength of connection between the source terminal 3 and the source pad electrode 2s of the semiconductor chip 2 and the strength of connection between the first portion 5a of the drain terminal 5 and the back-surface drain electrode 2d of the semiconductor chip 2. In the semiconductor device 1e shown in FIGS. 43 to 45, a stepped portion is formed in the lower surface 4a (the surface opposite to the upper surface 4c to which the semiconductor chip 2 is connected) of the gate terminal 4 so that the lower surface 4e of the gate terminal 4 located near the portion connected to the gate pad electrode 2g of the semiconductor chip 2 is sealed within the sealing resin portion 6 so as not to be exposed from the sealing resin portion. As a result, it is possible to suppress or prevent the exertion of stress (thermal stress) on the connection between the gate terminal 4 and the gate pad electrode 2g of the semiconductor chip 2 and hence possible to improve the reliability of the connection between the gate terminal 4 and the gate pad electrode 2g of the semiconductor chip 2.

Although the present invention has been described above concretely by way of embodiments thereof, it goes without saying that the present invention is not limited to the above embodiments, but that various changes may be made within the scope not departing from the gist of the invention.

The present invention is suitable for application to the technique of manufacturing a semiconductor device which is in the form of a resin sealed semiconductor package.

What is claimed is:

1. A method of manufacturing a semiconductor device comprising:
   a semiconductor chip;
   a first conductor portion joined to a first main surface of the semiconductor chip;
   a second conductor portion joined to a second main surface opposite to the first main surface of the semiconductor chip; and
   a sealing resin portion for sealing the semiconductor chip and a part of the first conductor portion and a part of the second conductor portion,
   a surface of the first conductor portion being exposed from a first surface of the sealing resin portion, and
   a surface of the second conductor portion being exposed from a second surface opposite to the first surface of the sealing resin portion,
   the method comprising the steps of:
   (a) joining the first conductor portion to the first main surface of the semiconductor chip;
   (b) joining the second conductor portion to the second main surface of the semiconductor chip;
   (c) after the steps (a) and (b), forming the sealing resin portion for sealing the semiconductor chip and the first and second conductor portions in such a manner as to cover the surface of the first conductor portion; and
   (d) after the step (c), removing a part on the first surface side of the sealing resin portion, thereby allowing the surface of the first conductor portion to be exposed.

2. The method according to claim 1, wherein, in the step (c), the first and second conductor portions and the semiconductor chip are disposed within a cavity of a mold and a material for forming the sealing resin portion is introduced into the cavity to form the sealing resin portion.

3. The method according to claim 2, wherein, in the step (c), the surface of the first conductor portion is not in contact with the mold.

4. The method according to claim 2, wherein the surface of the first conductor portion is a surface opposite to the side opposed to the first main surface of the semiconductor chip and, in the step (c), the mold does not press the surface of the first conductor portion.

5. The method according to claim 1, wherein, in the step (c), the sealing resin portion is formed in such a manner that the surface of the second conductor portion is exposed.

6. The method according to claim 1, wherein, in the step (d), a part on the first surface side of the sealing resin portion is removed using liquid honing.

7. The method according to claim 1, wherein the step (d) comprises the steps of:
   (d1) polishing the first surface side of the sealing resin portion with use of liquid honing; and
   (d2) polishing the second surface side of the sealing resin portion with use of liquid honing,
   wherein the surface of the first conductor portion is exposed by polishing the sealing resin portion in the step (d1), and
   wherein the amount of the sealing resin portion polished in the step (d1) is larger than the amount of the sealing resin portion polished in the step (d2).

8. The method according to claim 7, wherein the time of the liquid honing performed for the sealing resin portion in the step (d1) is longer than the time of the liquid honing performed for the sealing resin portion in the step (d2).

9. The method according to claim 7, wherein the pressure of the liquid honing performed for the sealing resin portion in the step (d1) is higher than the pressure of the liquid honing performed for the sealing resin portion in the step (d2).

10. The method according to claim 1, wherein, in the step (d), a part on the first surface side of the sealing resin portion is removed in such a manner that the surface of the first conductor portion projects from the first surface of the sealing resin portion.

11. The method according to claim 10, wherein, in the step (d), a part on the second surface side of the sealing resin portion is removed in such a manner that the surface of the second conductor portion projects from the second surface of the sealing resin portion.

12. The method according to claim 1, wherein, in the step (d), a part on the first surface side of the sealing resin portion is removed by mechanical polishing.

13. The method according to claim 1, wherein, in the step (d), a part on the first surface side of the sealing resin portion is removed by both mechanical polishing and liquid honing.

14. The method according to claim 1, wherein a surface different from said surface of the first conductor portion is exposed to the second surface of the sealing resin portion, and the surface of the second conductor portion and the different surface of the first conductor portion function as terminals in the semiconductor device.

15. The method according to claim 1,
   wherein, in the step (a), the first conductor portion is joined and electrically connected to an electrode formed over the first main surface of the semiconductor chip, and
   wherein, in the step (b), the second conductor portion is joined and electrically connected to an electrode formed over the second main surface of the semiconductor chip.

16. The method according to claim 1, wherein the semiconductor chip is a semiconductor chip formed with a power MISFET.

17. A method of manufacturing a semiconductor device comprising:
   a semiconductor chip;
   a first conductor portion joined to a first main surface of the semiconductor chip;

a second conductor portion joined to a second main surface opposite to the first main surface of the semiconductor chip; and a sealing resin portion for sealing the semiconductor chip and a part of the first conductor portion and a part of the second conductor portion, a surface of the first conductor portion being exposed from a first surface of the sealing resin portion, and a surface of the second conductor portion being exposed from a second surface opposite to the first surface of the sealing resin portion, the method comprising the steps of:

(a) providing a first conductor member having the first conductor portion, a second conductor member having the second conductor portion, and the semiconductor chip;

(b) joining the first conductor portion of the first conductor member to the first main surface of the semiconductor chip;

(c) joining the second conductor portion of the second conductor member to the second main surface of the semiconductor chip;

(d) after the steps (b) and (c), fixing the first and second conductor members to a mold in such a manner that the first and second conductor members and the semiconductor chip are disposed within a cavity of the mold, and introducing a sealing resin material into the cavity to seal the semiconductor chip and the first and second conductor portion; and (e) after the step (d), removing a part of the sealing resin portion, wherein the surface of the first conductor portion is a surface located on a side opposite to the side opposed to the first main surface of the semiconductor chip, wherein, in the step (d), the first and second conductor members are fixed to the mold in such a manner that the mold does not press the surface of the first conductor portion, and wherein, in the step (e), a part on the first surface side of the sealing resin portion is removed in such a manner that the surface of the first conductor portion is exposed.

18. The method according to claim 17, wherein, in the step (d), the surface of the first conductor portion is not in contact with the mold.

19. The method according to claim 17, wherein, in the step (d), the sealing resin portion is formed so as to cover the surface of the first conductor portion from above.

20. The method according to claim 17, wherein, in the step (d), the sealing resin portion is formed in such a manner that the surface of the second conductor portion is exposed.

21. The method according to claim 17, wherein, in the step (e), a part on the first surface side of the sealing resin portion is removed using liquid honing.

22. The method according to claim 17, wherein the first or the second conductor member is a lead frame.

* * * * *